United States Patent
Song

(10) Patent No.: US 11,195,996 B2
(45) Date of Patent: Dec. 7, 2021

(54) PHASE-CHANGE MEMORY DEVICE HAVING REVERSED PHASE-CHANGE CHARACTERISTICS AND PHASE-CHANGE MEMORY HAVING HIGHLY INTEGRATED THREE-DIMENSIONAL ARCHITECTURE USING SAME

(71) Applicant: Samsung Electronics Co., Ltd., Suwon-si (KR)

(72) Inventor: Yun Heub Song, Seoul (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 80 days.

(21) Appl. No.: 16/620,577

(22) PCT Filed: Jun. 1, 2018

(86) PCT No.: PCT/KR2018/006317
§ 371 (c)(1),
(2) Date: Dec. 9, 2019

(87) PCT Pub. No.: WO2018/225993
PCT Pub. Date: Dec. 13, 2018

(65) Prior Publication Data
US 2020/0168792 A1    May 28, 2020

(30) Foreign Application Priority Data

Jun. 7, 2017 (KR) .................. 10-2017-0070892
Jun. 29, 2017 (KR) .................. 10-2017-0082386
Nov. 28, 2017 (KR) .................. 10-2017-0160268

(51) Int. Cl.
G11C 11/00       (2006.01)
H01L 45/00       (2006.01)
(Continued)

(52) U.S. Cl.
CPC ............ *H01L 45/06* (2013.01); *G11C 13/003* (2013.01); *G11C 13/004* (2013.01);
(Continued)

(58) Field of Classification Search
CPC .. G11C 13/0004; G11C 13/004; G11C 13/003
(Continued)

(56) References Cited

U.S. PATENT DOCUMENTS

2009/0021977 A1    1/2009 Kang et al.
2009/0250682 A1    10/2009 Park et al.
(Continued)

FOREIGN PATENT DOCUMENTS

KR    10-2009-0009652 A    1/2009
KR    10-2009-0107320 A    10/2009
(Continued)

OTHER PUBLICATIONS

Derchang Kau et al., "A stackable cross point phase change memory," IEEE International Electron Devices Meeting (IEDM), Mar. 29, 2010, p. 27.1.1-27.1.4.
(Continued)

*Primary Examiner* — Vu A Le
(74) *Attorney, Agent, or Firm* — Harness, Dickey & Pierce, P.L.C.

(57) ABSTRACT

According to an embodiment, a phase-change memory device comprises: an upper electrode and a lower electrode; a phase-change layer in which a crystal state thereof is changed by heat supplied by the upper electrode and the lower electrode; and a selector which selectively switches the heat supplied by the upper electrode and the lower electrode to the phase-change layer, wherein the selector is formed of a compound which includes a transition metal in the phase-change material so as to have a high resistance when the crystalline state of the selector is crystalline and so (Continued)

as to have a low resistance when the crystalline state of the selector is non-crystalline.

14 Claims, 26 Drawing Sheets

(51) Int. Cl.
  *H01L 27/24* (2006.01)
  *G11C 13/00* (2006.01)
(52) U.S. Cl.
  CPC ...... *G11C 13/0004* (2013.01); *G11C 13/0069* (2013.01); *G11C 13/0097* (2013.01); *H01L 27/2427* (2013.01); *H01L 27/2481* (2013.01); *H01L 45/126* (2013.01); *H01L 45/1233* (2013.01); *H01L 45/1246* (2013.01); *H01L 45/144* (2013.01); *H01L 45/1616* (2013.01); *H01L 45/1683* (2013.01); *G11C 2213/54* (2013.01); *G11C 2213/71* (2013.01); *G11C 2213/72* (2013.01)
(58) Field of Classification Search
  USPC ......................................................... 365/163
  See application file for complete search history.

(56) References Cited

U.S. PATENT DOCUMENTS

| 2014/0151622 A1* | 6/2014 | Oyanagi | H01L 45/144 |
| | | | 257/2 |
| 2017/0033279 A1* | 2/2017 | Lee | H01L 45/141 |
| 2017/0236873 A1* | 8/2017 | Chen | H01L 45/04 |
| | | | 438/382 |

FOREIGN PATENT DOCUMENTS

| KR | 10-1167551 B1 | 7/2012 |
| KR | 10-2012-0097634 A | 9/2012 |

OTHER PUBLICATIONS

International Search Report of PCT/KR2018/006317 dated Sep. 3, 2018.

\* cited by examiner

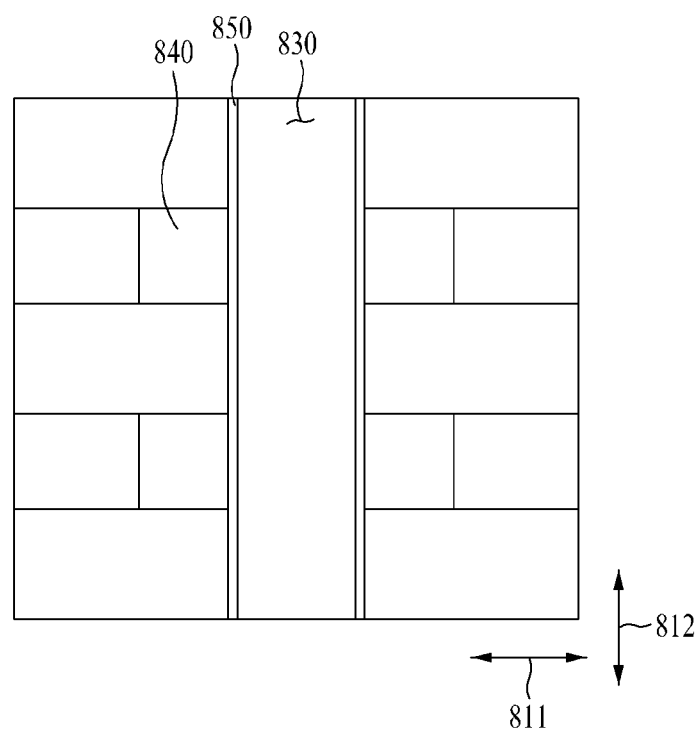

PHASE-CHANGE MEMORY DEVICE HAVING REVERSED PHASE-CHANGE CHARACTERISTICS AND PHASE-CHANGE MEMORY HAVING HIGHLY INTEGRATED THREE-DIMENSIONAL ARCHITECTURE USING SAME

CROSS REFERENCE TO RELATED APPLICATIONS

This application is a National Stage of International Application No. PCT/KR2018/006317 filed Jun. 1, 2018, claiming priority based on Korean Patent Application No. 10-2017-0070892 filed Jun. 7, 2017, Korean Patent Application No. 10-2017-0082386 filed Jun. 29, 2017, and Korean Patent Application No. 10-2017-0160268 filed Nov. 28, 2017.

TECHNICAL FIELD

Embodiments of the inventive concept described herein relate to a selector used in a memory device, a phase-change random access memory element (PCRAM element) including the selector, and a phase-change memory having a highly integrated three-dimensional architecture configured to use the phase-change random access memory element including the selector, and more particularly, relate to a selector which improves problems and disadvantages of a conventional ovonic threshold switching (OTS) used as a selection element in a memory device.

BACKGROUND ART

With rapid development of IT technology, there is a demand for a next-generation memory device having characteristics such as high speed, large capacity, and high integration. The next-generation memory device is suitable for the development of portable information and communication systems and devices which process a large amount of information with barges. Therefore, a three dimensional V-NAND memory currently implements the highest density. However, the more stages, the higher the string height. Therefore, it is expected that the implementation of ultra-high density will be limited due to process difficulty of forming more than 100 stages.

In order to replace V-NAND, next-generation memory devices, such as STT-MRAM, FeRAM, ReRAM, and PCRAM, which are superior in power, data retention, and write/read characteristics in comparison to general memory device, have studied.

Among them, the PCRAM (hereinafter, referred to as a phase-change memory device) may change a crystal state of the phase-change layer between crystalline and non-crystalline depending on supplying heat caused by current flow or applied voltage difference between an upper electrode and a lower electrode to the phase-change layer to have a low resistance when the crystal state of the phase-change layer is crystalline and to have a high resistance when the crystal state of the phase-change layer is non-crystalline, thereby exhibiting binary values corresponding to the resistance states, respectively (e.g., when the crystal state of the phase-change layer is crystalline to have the low resistance, a set state of a binary value [0] is shown and when the crystal state of the phase-change layer is non-crystalline to have the high resistance, a reset state of the binary value [1] is shown).

The phase-change memory device is actively researched as a next-generation semiconductor memory device because of low manufacturing cost and high speed operation, and proposed as a phase-change memory implemented with various three-dimensional architectures to improve two-dimensional scaling limits.

However, since the conventional OTS used as the selection element in the phase-change memory (or a phase-change memory device) requires an intermediate electrode, which is disposed between the OTS and the phase-change layer and is in contact with the phase-change layer, it is not suitable for implementing high integration. When the intermediate electrode is removed, there is a problem that a malfunction occurs due to a thermal effect between the phase-change layers.

Therefore, there is an urgent need for the development of new selection element to be used in highly integrated three-dimensional architecture.

DETAILED DESCRIPTION OF THE INVENTION

Technical Problem

Embodiments of the inventive concepts provide a selector as a selection element, which improves problems and disadvantages of conventional OTS and exhibits a reversed phase-change characteristics having a high resistance when a crystal state of the selector is crystalline and having a low resistance when the crystal state of the selector is non-crystalline, to lower an operating voltage and power consumption.

Also, embodiments of the inventive concepts provide a selector having reversed phase-change characteristics used in a phase-change memory to implement a highly integrated three-dimensional architecture as compared to a conventional three-dimensional V-NAND memory and to reduce a manufacturing cost for implementing the phase-change memory as compared to a conventional three-dimensional X point array PCRAM.

Technical Solution

According to an exemplary embodiment, a phase-change memory device includes an upper electrode and a lower electrode, a phase-change layer in which a crystal state thereof is changed by heat supplied by the upper electrode and the lower electrode, and a selector which selectively switches the heat supplied by the upper electrode and the lower electrode to the phase-change layer, wherein the selector is formed of a compound which includes a transition metal in a phase-change material so as to have a high resistance when the crystal state of the selector is crystalline and so as to have a low resistance when the crystal state of the selector is non-crystalline.

According to an aspect, a composition ratio in which the transition metal is contained in the phase-change material may be adjusted to maximize a resistance ratio between when the crystal state of the selector is crystalline and when the crystal state of the selector is non-crystalline, to allow an operating voltage value of the selector to be less than a reference operating voltage value, or to allow a power consumption of the selector to be less than a reference power consumption value.

According to another aspect, the phase-change layer and the selector may have different phase-change characteristics from each other.

According to another aspect, the phase-change memory device may perform a set operation of a write operation in response to the crystal state of the selector being changed to crystalline to be set to a high resistance state and the crystal state of the phase-change layer being changed to crystalline to be set to a low resistance state, and may perform a reset operation of the write operation in response to the crystal state of the selector being changed to non-crystalline to be set to a low resistance state and the crystal state of the phase-change layer being changed to non-crystalline to be set to a high resistance state.

According to another aspect, the selector may maintain an off state in response to the phase-change memory device being set to the high resistance state in both the set operation and the reset operation.

According to another aspect, the phase-change memory device may perform a read operation in response to a crystal state of a local region being changed from non-crystalline to crystalline to be set to an off state after the crystal state of the local region is changed from crystalline to non-crystalline to be set to an on state.

According to another aspect, the phase-change memory device may further include a tunnel barrier disposed between the phase-change layer and the selector to reduce an off current of the selector or block intermixing between the phase-change layer and the selector.

According to another aspect, the transition metal may include at least one of Cr, Ti, Ni, Zn, Cu, or Mo, and the phase-change material may include Ge and/or Te.

According to another aspect, the selector may adjust contact resistivity based on a material forming either the upper electrode or the lower electrode.

According to an exemplary embodiment, a selector used in a memory device is formed of a compound containing a transition metal in a phase-change material to have a high resistance when a crystal state of the selector is crystalline and to have a low resistance when the crystal state of the selector is non-crystalline.

According to an aspect, a composition ratio in which in which the transition metal is contained in the phase-change material may be adjusted to maximize a resistance ratio between when the crystal state of the selector is crystalline and when the crystal state of the selector is non-crystalline, to allow an operating voltage value of the selector to be less than a reference operating voltage value, or to allow a power consumption of the selector to be less than a reference power consumption value.

According to another aspect, the selector may change a crystal state of a local region between crystalline and non-crystalline to be switched between an on state and an off state.

According to another aspect, the selector may further include a tunnel barrier disposed between at least one electrode included in the memory device and the selector to reduce an off current of the selector.

According to an exemplary embodiment, a phase-change layer used in a phase-change memory device including an upper electrode and a lower electrode is formed of a compound containing a transition metal in a phase-change material to change a crystal state by heat supplied by the upper electrode and the lower electrode, to have a high resistance when the crystal state of the phase-change layer is crystalline and to have a low resistance when the crystal state of phase-change layer is non-crystalline.

According to an aspect, the phase-change memory device may further include a tunnel barrier disposed between any one of the upper electrode or the lower electrode and the phase-change layer.

According to another aspect, the phase-change memory device may further include an ovonic threshold switching (OTS) selectively switching the heat supplied by the upper electrode and the lower electrode to the phase-change layer.

According to an exemplary embodiment, a phase-change memory device includes an upper electrode and a lower electrode and a phase-change layer changing a crystal state by heat supplied by the upper electrode and the lower electrode and being formed of a compound which includes a transition metal in a phase-change material to have a high resistance when a crystal state of the phase-change layer is crystalline and to have a low resistance when the crystal state of the phase-change layer is non-crystalline.

According to an aspect, a Schottky barrier may be formed between the upper electrode or the lower electrode and the phase-change layer by a work function.

According to an exemplary embodiment, a phase-change memory having a highly integrated three-dimensional architecture includes at least one horizontal electrode extending in a first direction and a vertical electrode extending in a second direction perpendicular to the first direction, at least one phase-change layer extending in the first direction to be in contact with the at least one horizontal electrode, respectively, to change a crystal state of the at least one phase-change layer by heat supplied by the at least one horizontal electrode and the vertical electrode, and a selector extending in the second direction to be in contact with the at least one phase-change layer and the vertical electrode, respectively, and selectively switching the heat supplied by the at least one horizontal electrode and the vertical electrode to the at least one phase-change layer to change a crystal state of a target phase-change layer of the at least one phase-change layer, wherein the selector is formed of a compound containing a transition metal in a phase-change material to have a high resistance when a crystal state of the selector is crystalline and to have a low resistance when the crystal state of the selector is non-crystalline.

According to an aspect, a composition ratio in which in which the transition metal is contained in the phase-change material may be adjusted to maximize a resistance ratio between when the crystal state of the selector is crystalline and when the crystal state of the selector is non-crystalline, to allow an operating voltage value of the selector to be less than a reference operating voltage value, or to allow a power consumption of the selector to be less than a reference power consumption value.

According to another aspect, the phase-change memory may perform a set operation of a write operation on the target phase-change layer in response to a crystal state of a region corresponding to the target phase-change layer of the selector being changed to crystalline to be set to a high resistance state and the crystal state of the region corresponding to the target phase-change layer being changed to crystalline to be set to a low resistance state, and may perform a reset operation of the write operation on the target phase-change layer in response to the crystal state of the region corresponding to the target phase-change layer of the selector being changed to non-crystalline to be set to the low resistance state and the crystal state of the region corresponding to the target phase-change layer being changed to non-crystalline to be set to the high resistance state.

According to another aspect, the region corresponding to the target phase-change layer of the selector may maintain an off state in response to the phase-change memory being set to the high resistance state in both the set operation and the reset operation.

According to another aspect, the phase-change memory may perform a read operation in response to a region corresponding to the target phase-change layer of the selector changing a crystal state of a local region from non-crystalline to crystalline to be set to an off state after the crystal state of the local region is changed from crystalline to non-crystalline to be set to an on state.

According to another aspect, the phase-change memory may further include a tunnel barrier disposed between the at least one phase-change layer and the selector and extending in the second direction to reduce an off current of the selector.

According to another aspect, the selector may block a leakage current to the phase-change layer adjacent to the target phase-change layer among the at least one phase-change layer when the crystal state of the target phase-change layer is changed.

According to another aspect, the phase-change memory may further include at least one insulating layer extending in the first direction to be interposed between the at least one phase-change layer and separating the at least one phase-change layer from each other.

According to an exemplary embodiment, a phase-change memory having a highly integrated three-dimensional architecture includes at least one horizontal electrode extending in a first direction and a vertical electrode extending in a second direction perpendicular to the first direction, and at least one phase-change layer extending in the first direction to be in contact with the at least one horizontal electrode, respectively, to change a crystal state of the at least one phase-change layer by heat supplied by the at least one horizontal electrode and the vertical electrode, wherein the at least one phase-change layer is formed of a compound containing a transition metal in a phase-change material to have a high resistance when the crystal state of the at least one phase-change layer is crystalline and to have a low resistance when the crystal state of the at least one phase-change layer is non-crystalline.

According to an aspect, the phase-change memory may further include a tunnel barrier disposed between the at least one phase-change layer and the vertical electrode and extending in the second direction.

According to an exemplary embodiment, a method of a phase-change memory having a highly integrated three-dimensional architecture includes alternately stacking at least one insulating layer and at least one horizontal electrode extending in a first direction, forming a vertical hole through the stacked at least one insulating layer and at least one horizontal electrode in a second direction perpendicular to the first direction, etching a portion of the at least one horizontal electrode exposed on an inner surface of the vertical hole, filling at least one phase-change layer in a space where the portion of the at least one horizontal electrode is etched, forming a selector on the inner surface of the vertical hole to be in contact with the at least one phase-change layer, and filling a vertical electrode in the vertical hole in which the selector is formed, wherein the selector is formed of a compound containing a transition metal in a phase-change material to have a high resistance when a crystal state of the selector is crystalline and to have a low resistance when the crystal state of the selector is non-crystalline.

According to an aspect, the forming of the selector on the inner surface of the vertical hole to be in contact with the at least one phase-change layer may include adjusting a composition ratio in which the transition metal is contained in the phase-change material to maximize a resistance ratio between when the crystal state of the selector is crystalline and when the crystal state of the selector is non-crystalline, to allow an operating voltage value of the selector to be less than a reference operating voltage value, or to allow a power consumption of the selector to be less than a reference power consumption value.

According to another aspect, the forming of the selector on the inner surface of the vertical hole to be in contact with the at least one phase-change layer may include forming a tunnel barrier on the inner surface of the vertical hole to be in contact with the at least one phase-change layer to reduce an off current of the selector, and forming the selector on the inner surface of the vertical hole where the tunnel barrier is formed to be in contact with the tunnel barrier.

According to another aspect, the filling of the at least one phase-change layer in the space where the portion of the at least one horizontal electrode is etched may include filling the at least one phase-change layer in the space where the portion of the at least one horizontal electrode is etched using atomic layer deposition (ALD) technique.

According to an exemplary embodiment, a method of a phase-change memory having a highly integrated three-dimensional architecture includes alternately stacking at least one insulating layer and at least one sacrificial layer extending in a first direction, forming a vertical hole through the stacked at least one insulating layer and at least one sacrificial layer in a second direction perpendicular to the first direction, etching a portion of the at least one sacrificial layer exposed on an inner surface of the vertical hole, filling at least one phase-change layer in a space where the portion of the at least one sacrificial layer is etched, forming a selector on the inner surface of the vertical hole to be in contact with the at least one phase-change layer, filling a vertical electrode in the vertical hole in which the selector is formed, removing the at least one sacrificial layer, and filling at least one horizontal electrode in a space from which the at least one sacrificial layer is removed, wherein the selector is formed of a compound containing a transition metal in a phase-change material to have a high resistance when a crystal state of the selector is crystalline and to have a low resistance when the crystal state of the selector is non-crystalline.

According to an aspect, the forming of the selector on the inner surface of the vertical hole to be in contact with the at least one phase-change layer may include adjusting a composition ratio in which in which the transition metal is contained in the phase-change material to maximize a resistance ratio between when the crystal state of the selector is crystalline and when the crystal state of the selector is non-crystalline, to allow an operating voltage value of the selector to be less than a reference operating voltage value, or to allow a power consumption of the selector to be less than a reference power consumption value.

According to another aspect, the forming of the selector on the inner surface of the vertical hole to be in contact with the at least one phase-change layer may include forming a tunnel barrier on the inner surface of the vertical hole to be in contact with the at least one phase-change layer to reduce an off current of the selector and forming the selector on the inner surface of the vertical hole where the tunnel barrier is formed to be in contact with the tunnel barrier.

According to another aspect, the filling of the at least one phase-change layer in the space where the portion of the at least one sacrificial layer is etched may include filling the at least one phase-change layer in the space where the portion of the at least one sacrificial layer is etched using atomic layer deposition (ALD) technique.

Advantageous Effects of the Invention

In an embodiment, a selector having reversed phase-change characteristics having a high resistance when a crystal state is crystalline and having a low resistance when the crystal state is non-crystalline may be proposed as a selection element to improve problems and disadvantages of the conventional OTS and to lower the operating voltage and power consumption.

Furthermore, in an embodiment, a selector having reversed phase-change characteristics is used in a phase-change memory to implement a highly integrated three-dimensional architecture as compared to the conventional three-dimensional V-NAND memory and to reduce manufacturing cost for implementing the phase-change memory as compared to the conventional three-dimensional X point array PCRAM.

DESCRIPTION OF THE DRAWINGS

The above and other objects and features will become apparent from the following description with reference to the following figures, wherein like reference numerals refer to like parts throughout the various figures unless otherwise specified, and wherein:

FIGS. 8A to 8H are views sequentially illustrating cross-sections of a phase-change memory for explaining a method of manufacturing a phase-change memory according to another embodiment;

BEST MODE

Figure 1A:
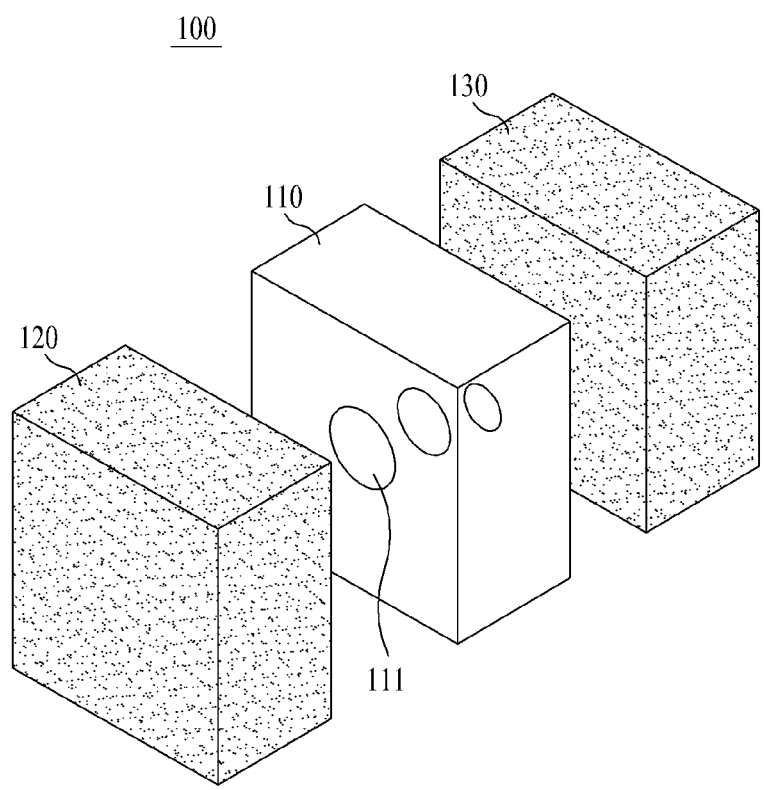
FIG. 1A is a view illustrating a selector according to an embodiment of the present invention.

Hereinafter, embodiments will be described in detail with reference to the accompanying drawings. However, the present invention is not defined or limited by the embodiments. Also, like reference numerals in the drawings denote like elements.

In addition, terms (terminology) used in the present specification are terms used to properly express the preferred embodiment of the present invention, which may vary according to a user, an operator's intention, or customs in the field to which the present invention belongs. Therefore, the definitions of the terms should be made based on the contents throughout the specification.

FIG. 1A is a view illustrating a selector according to an embodiment of the present invention.

Referring to FIG. 1A, a selector 110 according to an embodiment may be a selection element used in a memory device 100, for example, may serve to selectively switch heat (heat caused by current flow or applied voltage difference between an upper electrode 120 and a lower electrode 130), which is supplied by the upper electrode 120 and the lower electrode 130 included in a phase-change memory device, to a phase-change layer (not shown). For example, the selector 110 may perform a function of a memory selector or ovonic threshold switching (OTS) for switching operation on a memory layer (the phase-change layer).

However, the selector 110 described below is not defined or limited to those used in the phase-change memory device, and is available in nonvolatile memory device such as STT-M RAM, FeRAM, or ReRAM.

The selector 110 is formed of a compound containing a transition metal in a phase-change material to have reversed phase-change characteristics (have a high resistance when a crystal state is crystalline and a low resistance when the crystal state is non-crystalline).

For example, a phase-change layer formed of conventional phase-change materials (Ge2Sb2Te5) such as Ge, Sb and/or Te has phase-change characteristics where the phase-change layer has a low resistance when the crystal state is crystalline and the phase-change layer has a high resistance when the crystal state is non-crystalline. Accordingly, the selector 110 according to an embodiment is formed of a compound containing a transition metal such as Cr, Ti, Ni, Zn, Cu, and/or Mo in the conventional phase-change materials such as Ge and/or Te to have reversed phase-change characteristics where the selector 110 has a high resistance of $1*10^5$ ohm when the crystal state is crystalline and the selector 110 has a low resistance of $8.6*10^2$ ohm when the crystal state is non-crystalline.

Here, having the high resistance when the crystal state of the selector 110 is crystalline means having a relatively high resistance based on a resistance of when the crystal state is the non-crystalline. Also, having the low resistance when the crystal state of the selector 110 is non-crystalline means having a relatively low resistance based on a resistance of when the crystal state is crystalline. That is, having high resistance or low resistance depending on the crystal state of the selector 110 means that a value of the resistance compared with each other is high or low.

As described above, as the selector 110 is formed of the compound containing the transition metal in the phase-change material, the crystal state may be changed based on 290° C. suitable for a temperature value (on/off temperature value of the selection element to increase a grain size) at which the selection element used in the memory device is turned on/off (the crystal state of the selector 110 is crystallized at 290° C. or more).

In addition, as the selector 110 is formed of the compound containing the transition metal in the phase-change material, contact resistivity may be rapidly increased by crystallization, carrier density may be rapidly decreased, a total resistance of the memory device 100 may be drastically reduced in an initial increase of an non-crystalline fraction, and a current may be rapidly increased as interface resistance decreases, thereby implementing low energy switching.

Here, a composition ratio in which the transition metal is contained in the phase-change material may be adaptively adjusted to maximize a resistance ratio between when the crystal state of the selector 110 is crystalline and when the crystal state of the selector 110 is non-crystalline, to allow an operating voltage value of the selector 110 to be less than a reference operating voltage value, or to allow power consumption of the selector 110 to be less than a reference power consumption value.

For example, the composition ratio of the transition metal such as Cr (or Ti, Ni, Zn, Cu, Mo, etc.) in the phase-change material such as Ge and Te may be adjusted to be less than 10% by weight based on Ge and Te and thus, the selector 110 formed of a compound such as CrGeTe or $Cr_2Ge_2Te_6$ may have an operating voltage of less than 1V, an energy consumption (when a switch is turned-on) of less than 1 pJ, a power consumption ratio of the entire memory device 100 of less than 20%, an on/off ratio of more than $10^4$, an on current (current flowing when the switch is turned-on) of more than 1 $MA/cm^2$, an off current (current flowing when the switch is turned-off) of less than 1 pA, an operating speed of less than 50 ns, and endurance of more than 100 M.

In addition, the selector 110 may change the crystal state between crystalline and non-crystalline at a local region 111 thereof, not at an entire region, and may be switched between an on state and an off state, thereby significantly lowering the power consumption and energy consumption, as described above.

For example, in the selector 110, the composition ratio in which the transition metal is contained in the phase-change material may be adjusted to minimize a size of the local region 111, where the crystal state is changed between crystalline and non-crystalline, to less than 20% of the entire region.

Therefore, the power consumption during a switching operation which is switched between the on state and the off state may be significantly reduced.

In addition, the selector 110 may adjust the contact resistivity based on a material forming either the upper electrode 120 or the lower electrode 130. Thus, a bulk resistance may be determined as the contact resistivity is adjusted.

Furthermore, the selector 110 may further include a tunnel barrier. Detailed description thereof will be described with reference to FIG. 1B.

Figure 1B:
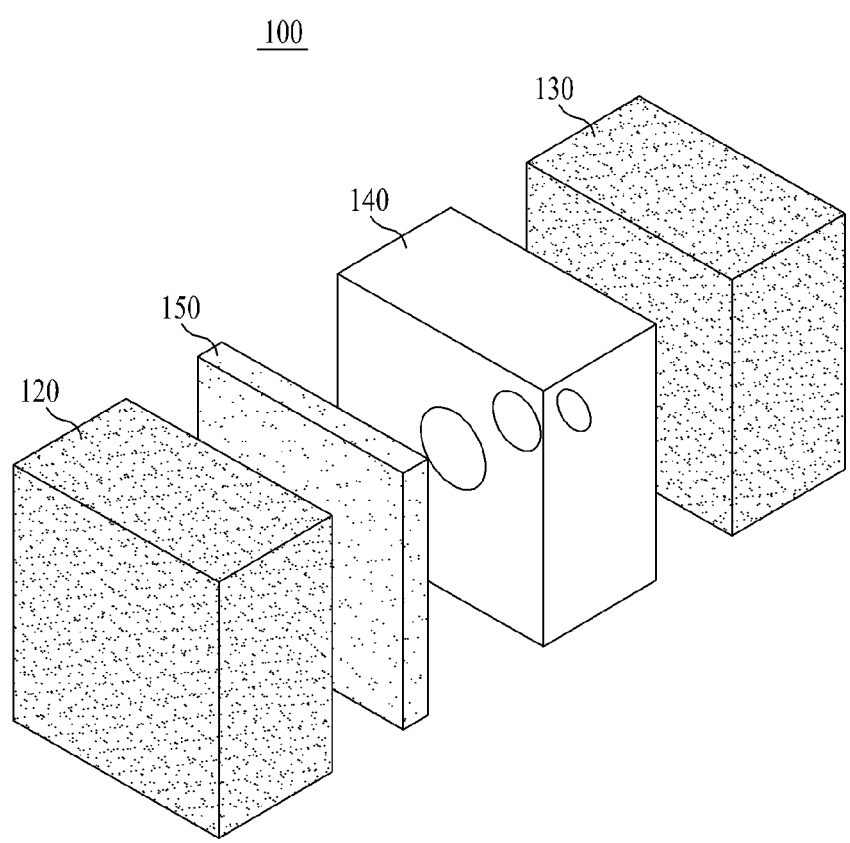
FIG. 1B is a view illustrating a selector according to another embodiment.

FIG. 1B is a view illustrating a selector according to another embodiment.

Referring to FIG. 1B, a selector 140 according to another embodiment is configured in the same manner as the selector illustrated in FIG. 1A, but is different in that the selector 140 further includes a tunnel barrier 150.

The tunnel barrier 150 may be disposed between the at least one electrode (the upper electrode 120 or the lower electrode 130) and the selector 140 included in the memory device 100, to physically and chemically shield a gap between the phase-change layer (not shown) and the selector 140 to prevent inter-diffusion and to flow tunneling current between the phase-change layer and the selector 140 through a tunneling effect of electrons. A blocking layer having a specific thickness or less (e.g., a blocking layer having a thickness of 5 nm or less) may be used as the tunnel barrier 150.

In addition, the tunnel barrier 150 may reduce an off current (current flowing when a switch is turned-off) of the selector 140 and suppress an increase of voltage (turn-on voltage) when the selector 140 is set to an on state to secure Schottky diode characteristics. The tunnel barrier 150 may be formed of $SiO_2$, $TiO_2$, or the like, and may be not defined or limited thereto. In addition, the tunnel barrier 150 may have material and thickness, which decrease the off current of the selector 140, suppress the increase of the turn-on voltage, and optimize the on/off ratio.

Figure 2A:
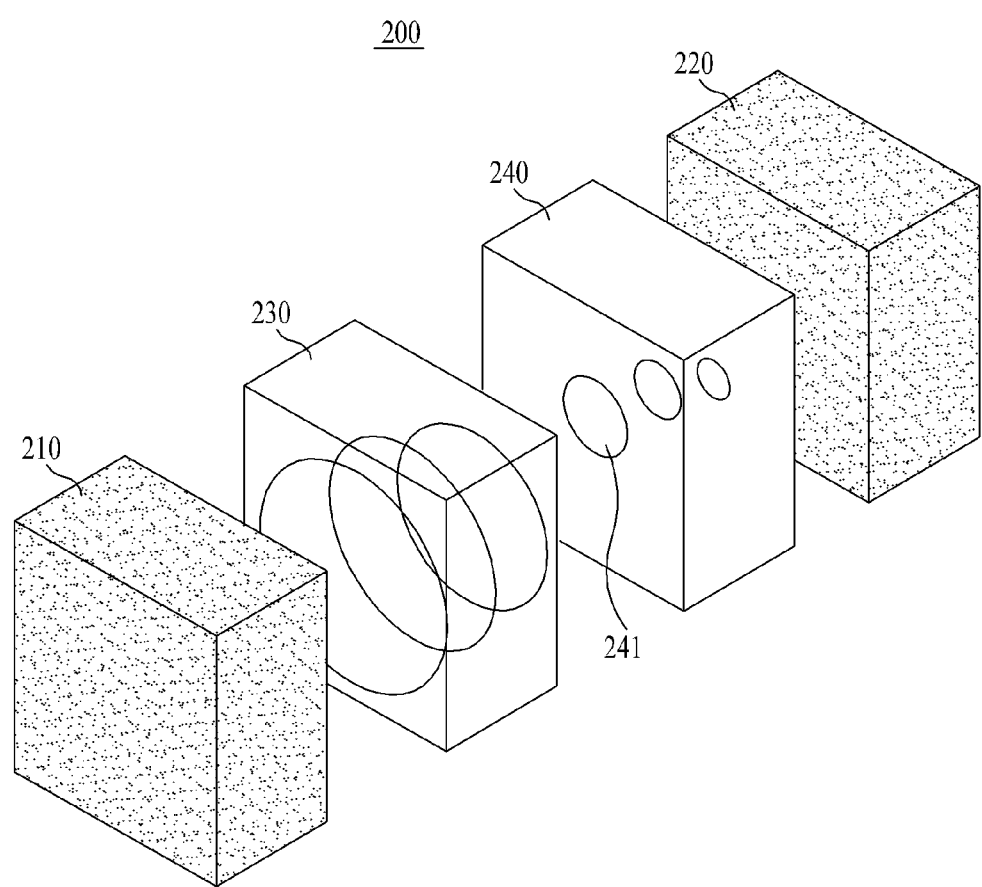
FIG. 2A is a diagram illustrating a phase-change memory device according to an embodiment.

FIG. 2A is a diagram illustrating a phase-change memory device according to an embodiment.

Referring to FIG. 2A, a phase-change memory device 200 according to an embodiment includes an upper electrode 210, a lower electrode 220, a phase-change layer 230, and a selector 240.

Each of the upper electrode 210 and the lower electrode 220 may be formed of a metal material such as W, TaN, TiN, and the like, which is suitable for characteristics of the selector 240 described later.

The phase-change layer 230 is formed of a phase-change material to allow a crystal state to be changed by heat (heat caused by current flow or applied voltage difference between the upper electrode 210 and the lower electrode 220) supplied by the upper electrode 210 and the lower electrode 220.

For example, the phase-change layer 230 is formed of a phase-change material ($Ge_2Sb_2Te_5$) such as Ge, Sb, and/or Te to have phase-change characteristics in which the phase-change layer 230 has a low resistance when the crystal state is crystalline and the phase-change layer 230 has a high resistance when the crystal state is non-crystalline. Here, having a low resistance when the crystal state of the phase-change layer 230 is crystalline means that having a relatively low resistance based on resistance when the crystal state is non-crystalline. Also, having a high resistance when the crystal state is non-crystalline means that having a relatively high resistance based on resistance when the crystal state is crystalline. That is, having low resistance or high resistance depending on the crystal state of the phase-change layer 230 means that a value of the resistance compared with each other is low or high.

The selector 240 is a selection element used in the phase-change memory device 200 and serves to selectively switch the heat supplied by the upper electrode 210 and the lower electrode 220 to the phase-change layer 230. For example, the selector 240 may perform a function of a memory selector or ovonic threshold switching (OTS) for switching a memory layer (the phase-change layer 230).

In particular, the selector 240 is formed of the compound containing the transition metal in the phase-change material to have the reversed phase-change characteristics (having the high resistance when the crystal state is crystalline and having the low resistance when the crystal state is non-crystalline), in the same manner as the selector shown in FIG. 1A.

As described above, as the selector 240 is formed of the compound containing the transition metal in the phase-change material, the crystal state may be changed based on 290° C. suitable for a temperature value (on/off temperature value of the selection element to increase a grain size) at which the selection element used in the memory device 200 is turned on/off (the crystal state of the selector 240 is crystallized at 290° C. or more).

In addition, as the selector 240 is formed of the compound containing the transition metal in the phase-change material, contact resistivity may be rapidly increased by crystallization, carrier density may be rapidly decreased, a total resistance of the phase-change memory device 200 may be drastically reduced in an initial increase of a non-crystalline fraction, and a current may be rapidly increased as interface resistance decreases, thereby implementing low energy switching.

Here, a composition ratio in which the transition metal is contained in the phase-change material may be adaptively adjusted to maximize a resistance ratio between when the crystal state of the selector 240 is crystalline and when the crystal state of the selector 240 is non-crystalline, to allow an operating voltage value of the selector 240 to be less than a reference operating voltage value, or to allow a power consumption of the selector 240 to be less than a reference power consumption value.

For example, the composition ratio of the transition metal such as Cr (or Ti, Ni, Zn, Cu, Mo, etc.) in the phase-change material such as Ge and Te may be adjusted to be less than 10% by weight based on Ge and Te and thus, the selector 240 formed of a compound such as CrGeTe or $Cr_2Ge_2Te_6$ may have an operating voltage of less than 1V, an energy consumption (when a switch is turned-on) of less than 1 pJ, a power consumption ratio of the entire memory device 100 of less than 20%, an on/off ratio of more than $10^4$, an on current (current flowing when the switch is turned-on) of more than 1 $MA/cm^2$, an off current (current flowing when the switch is turned-off) of less than 1 pA, an operating speed of less than 50 ns, and endurance of more than 100 M.

In addition, the selector 240 may change the crystal state between crystalline and non-crystalline at a local region 241 thereof, not at an entire region, and may be switched between an on state and an off state, thereby significantly lowering the power consumption and energy consumption, as described above.

For example, in the selector 240, the composition ratio in which the transition metal is contained in the phase-change material may be adjusted to minimize a size of the local region 241 where the crystal state is changed between crystalline and non-crystalline to less than 20% of the entire region. Therefore, the power consumption during a switching operation which is switched between the on state and the off state may be significantly reduced.

In addition, the selector 240 may adjust the contact resistivity based on a material forming either the upper electrode 210 or the lower electrode 220. Thus, a bulk resistance may be determined as the contact resistivity is adjusted.

Furthermore, the phase-change memory device 200 may further include a tunnel barrier. Detailed description thereof will be described with reference to FIG. 2B.

As described above, the phase-change memory device 200 includes the phase-change layer 230 and the selector 240 having different phase-change characteristics (the phase-change layer 230 having the phase-change characteristics and the selector 240 having the reversed phase-change characteristics). Thus, because the selector 240 is set to a high resistance state in both a set operation and a reset operation during a write operation, the selector 240 is always maintained in an off state and does not need to perform a separate switching off operation. In addition, the phase-change memory device 200 may perform a read operation in response to that the selector 240 changes the crystal state of the local region to be switched between the on state and the off state, thereby significantly reducing the power consumption and energy consumption. Detailed description thereof will be described with reference to FIG. 3.

In addition, a phase-change memory having a highly integrated three-dimensional architecture may be implemented based on the phase-change memory device 200. Detailed description thereof will be described with reference to FIGS. 4A and 4B.

Figure 2B:
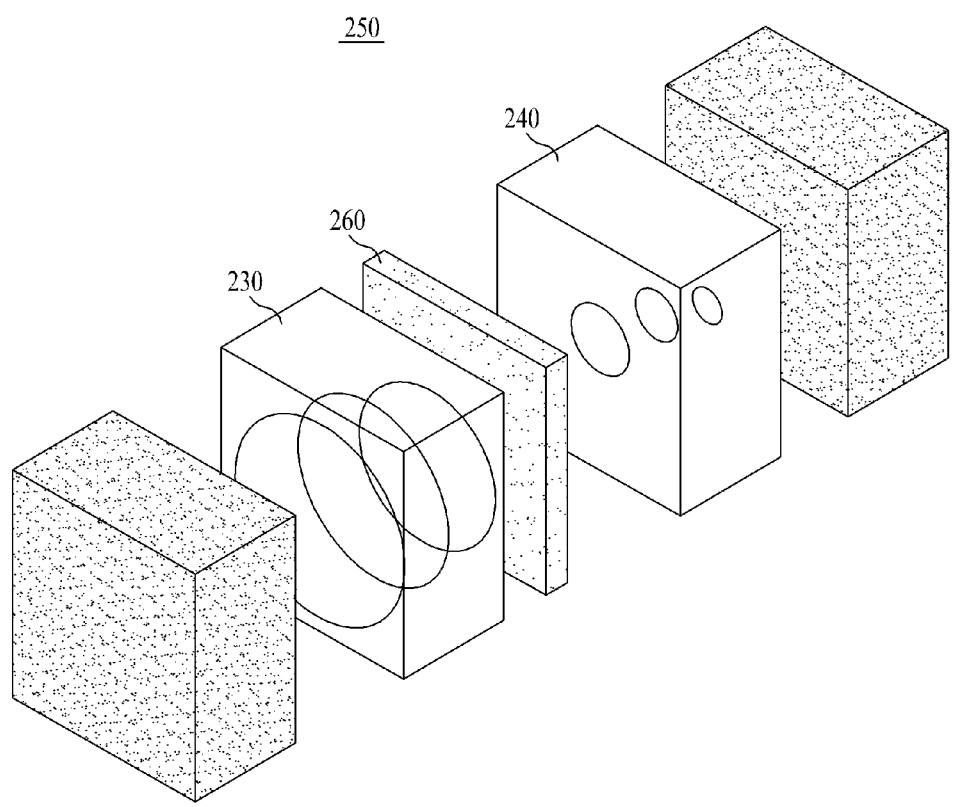
FIG. 2B is a diagram illustrating a phase-change memory device according to another embodiment.

FIG. 2B is a diagram illustrating a phase-change memory device according to another embodiment.

Referring to FIG. 2B, a phase-change memory device 250 according to another embodiment is configured in the same manner as the phase-change memory device shown in FIG. 2A, but is different in that phase-change memory device 250 further includes a tunnel barrier 260.

The tunnel barrier 260 may be disposed between the phase-change layer 230 and the selector 240 included in the phase-change memory device 250 physically and chemically shield a gap between the phase-change layer 230 and the selector 240 to prevent inter-diffusion, to block intermixing between the phase-change layer 230 and the selector 240, and to flow tunneling current between the phase-change layer 230 and the selector 240 through a tunneling effect of electrons. A blocking layer having a specific thickness or less (e.g., a blocking layer having a thickness of 5 nm or less) may be used as the tunnel barrier 260.

In addition, the tunnel barrier 260 may reduce an off current (current flowing when a switch is turned-off) of the selector 240 and suppress an increase of voltage (turn-on voltage) when the selector 240 is set to an on state to secure Schottky diode characteristics. The tunnel barrier 260 may be formed of $SiO_2$, $TiO_2$, or the like, and is not defined or limited thereto. In addition, the tunnel barrier 260 may have material and thickness, which decrease the off current of the selector 240, suppress the increase of the turn-on voltage, and optimize the on/off ratio.

Figure 3:
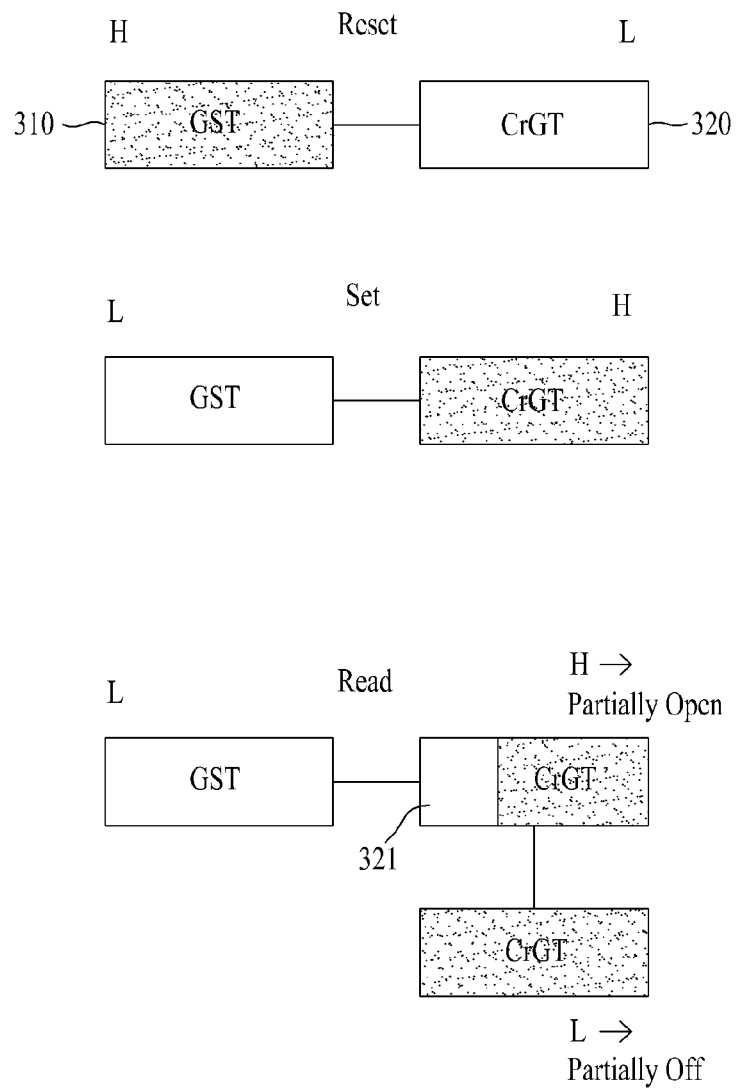
FIG. 3 is a diagram illustrating a method of operating a phase-change memory device according to an embodiment.

FIG. 3 is a diagram illustrating a method of operating a phase-change memory device according to an embodiment.

Referring to FIG. 3, a phase-change memory device according to an embodiment includes a phase-change layer 310 having phase-change characteristics and a selector 320 having reversed phase-change characteristics. Thus, because the selector 320 is set to a high resistance state in both a set operation and a reset operation during a write operation, the selector 320 is always off and does not need to perform a separate switching off operation.

Specifically, the phase-change memory device may perform a set operation of a write operation to have a memory state of binary value [1] in response to the crystal state of the selector 320 being changed to crystalline to be set to a high resistance state and the crystal state of the phase-change layer 310 being changed to crystalline to be set to a low resistance state. In addition, the phase-change memory device may perform a reset operation of the write operation to have a memory state of binary value [0] in response to the crystal state of the selector 320 being changed to non-crystalline to be set to a low resistance state and the crystal state of the phase-change layer being changed to non-crystalline to be set to a high resistance state.

Because either the phase-change layer 310 or the selector 320 is always set to the high resistance state in both the set operation and the reset operations and the phase-change memory device is set to the high resistance state through a cell in both the set operation and the reset operations, the selector 320 does not need to perform a separate switching off operation. Therefore, power consumption and energy consumption based on the separate switching off operation may be prevented.

In addition, the phase-change memory device may perform a read operation in response to that selector 320 changes the crystal state of a local region 321 to be switched between the on state and the off state.

In more detail, the phase-change memory device may perform the read operation in response to that the selector 320 changes the crystal state of the local region 321 from non-crystalline to crystalline to be set to an off state in 340 after the selector 320 changes the crystal state of the local region 321 from crystalline to non-crystalline to be set to an on state in 330.

That is, the phase-change memory device according to an embodiment may include the selector 320 which generates a phase-change in the local region 321 to be switched on or switched off, thereby significantly lowering power consumption and energy consumption for a switching operation.

Figure 4A:
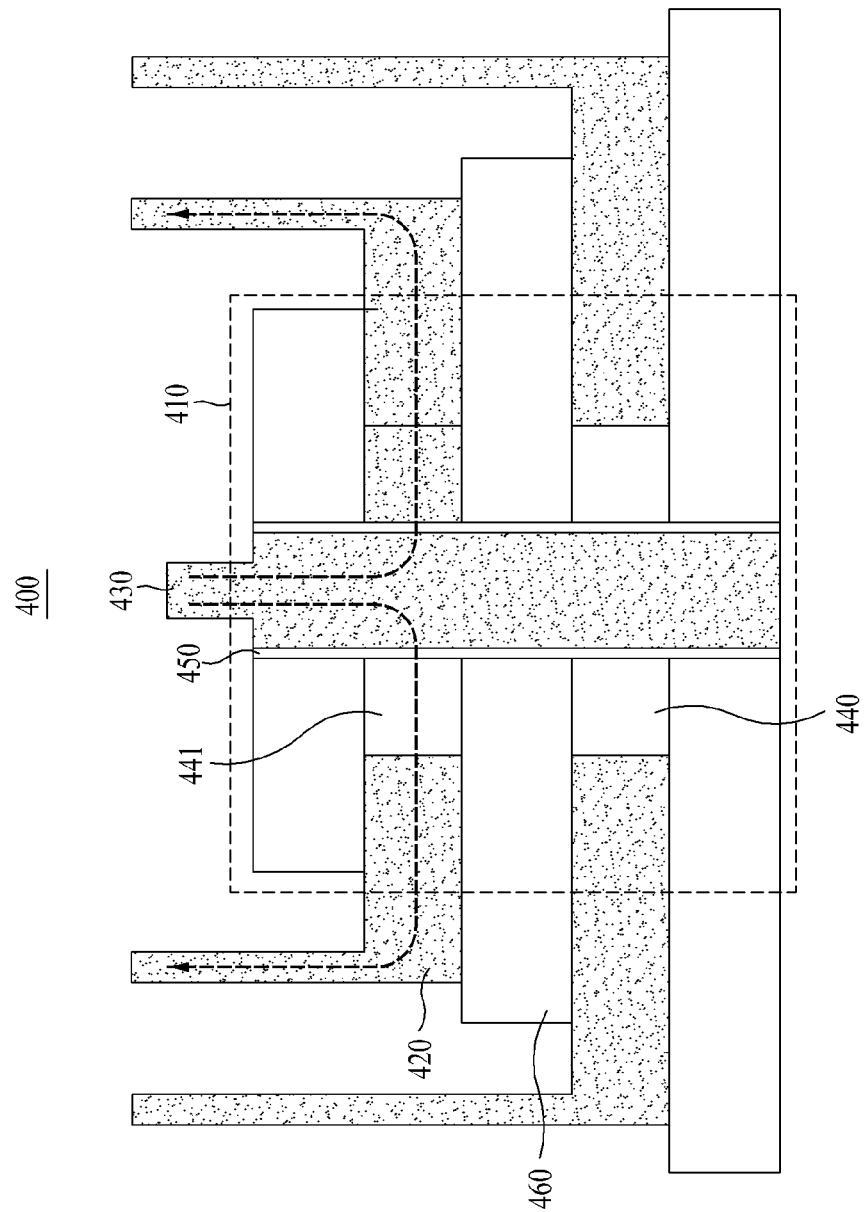
FIGS. 4A and 4B are diagrams illustrating a method of operating a phase-change memory device according to an embodiment.
Figure 4B:
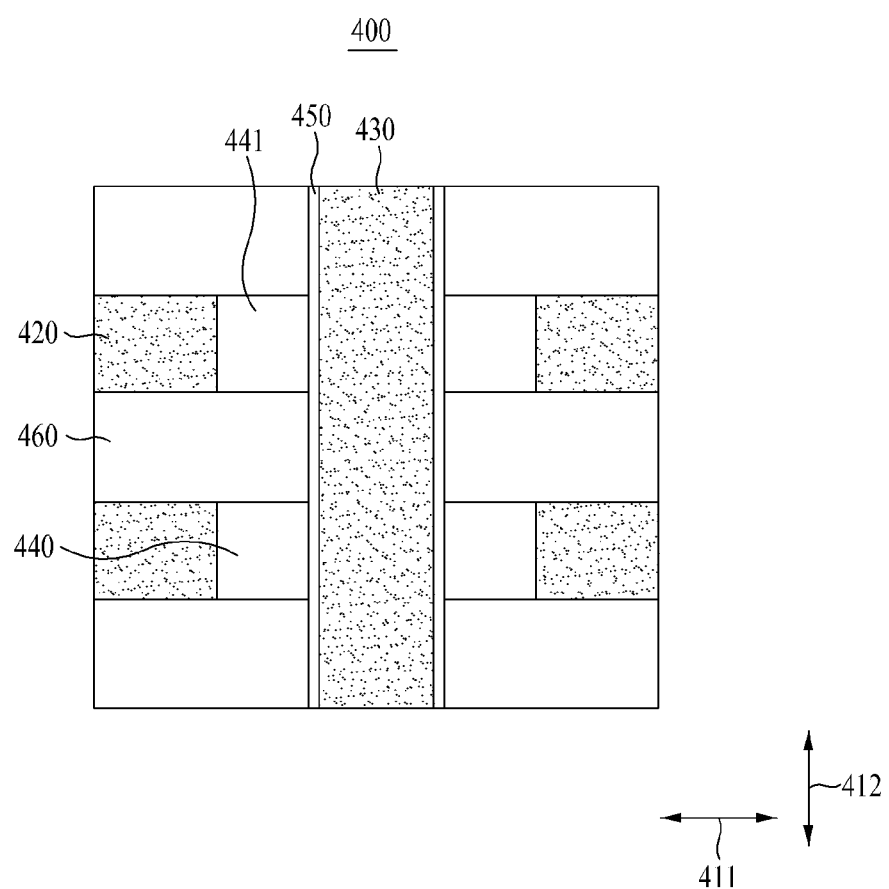

FIGS. 4A and 4B are diagrams illustrating a phase-change memory having a highly integrated three-dimensional architecture according to an embodiment. In detail, FIG. 4A is a diagram illustrating an entire cross-sectional view of a phase-change memory having a highly integrated three-dimensional architecture and FIG. 4B is an enlarged view of a portion 410 shown in FIG. 4A for convenience of explanation of the phase-change memory according to an embodiment.

Referring to FIGS. 4A and 4B, a phase-change memory 400 having a highly integrated three-dimensional architecture according to an embodiment includes at least one horizontal electrode 420 extending in a first direction 411, a vertical electrode 430 extending in a second direction 412 perpendicular to the first direction 411, at least one phase-change layer 440 extending in the first direction 411 and formed in contact with the at least one horizontal electrode 420, respectively, and a selector 450 formed in contact with the at least one phase-change layer 440 and the vertical electrode 430, respectively, and extending in the second direction 412.

Hereinafter, the at least one horizontal electrode 420 may correspond to the upper electrode described above with reference to FIG. 2A, and the vertical electrode 430 may correspond to the lower electrode described above with reference to FIG. 2A. Therefore, the at least one phase-change layer 440 and the selector 450 to be described later may correspond to the phase-change layer and the selector described above with reference to FIG. 2A.

Each of the at least one horizontal electrode 420 and the vertical electrode 430 may be formed of a metal material, such as W, TaN, TiN, and the like, suitable for the characteristics of the selector 450 to be described later. Here, the at least one horizontal electrode 420 may be grounded to ground.

The at least one phase-change layer 440 is formed of a phase-change material to allow a crystal state to be changed by heat (heat caused by current flow or applied voltage difference between the at least one horizontal electrode 420 and the vertical electrode 430) supplied by the at least one horizontal electrode 420 and the vertical electrode 430.

For example, the at least one phase-change layer 440 is formed of a phase-change material (Ge2Sb2Te5) such as Ge, Sb, and/or Te to have phase-change characteristics in which the at least one phase-change layer 440 has a low resistance when the crystal state is crystalline and the at least one phase-change layer 440 has high resistance when the crystal state is non-crystalline. Here, having a low resistance when the crystal state of the at least one phase-change layer 440 is crystalline means that having a relatively low resistance based on resistance when the crystal state is non-crystalline.

Also, having a high resistance when the crystal state of the at least one phase-change layer 440 is non-crystalline means that having a relatively high resistance based on resistance when the crystal state is crystalline. That is, having low resistance or high resistance depending on the crystal state of the at least one phase-change layer 440 means that a value of the resistance compared with each other is low or high.

The selector 450 is shared by the at least one phase-change layer 440 and serves to selectively switch the heat supplied by the at least one horizontal electrode 420 and the vertical electrode 430 to the at least one phase-change layer 440, thereby changing a crystal state of a target phase-change layer 441 of the at least one phase-change layer 440. That is, the selector 450 serves to switch the heat supplied by the at least one horizontal electrode 420 and the vertical electrode 430 to the target phase-change layer 441 of the at least one phase-change layer 440, thereby changing the crystal state of the target phase-change layer 441 of the at least one phase-change layer 440.

In particular, the selector 450 is formed of a compound containing a transition metal in the phase-change material to have reversed phase-change characteristics (having the high resistance when the crystal state is crystalline and having the low resistance when the crystal state is non-crystalline), in the same manner as the selector shown in FIG. 3A.

As described above, as the selector 240 is formed of the compound containing the transition metal in the phase-change material, the crystal state may be changed based on 290° C. suitable for a temperature value (on/off temperature value of the selection element to increase a grain size) at which a selection element used in the phase-change memory device 400 is turned on/off (the crystal state of the selector 450 is crystallized at 290° C. or more).

In addition, as the selector 450 is formed of the compound containing the transition metal in the phase-change material, contact resistivity may be rapidly increased by crystallization, carrier density may be rapidly decreased, a total resistance of the phase-change memory device 400 may be drastically reduced in an initial increase of a non-crystalline fraction, and a current may be rapidly increased as interface resistance decreases, thereby implementing low energy switching.

Here, a composition ratio in which the transition metal is contained in the phase-change material may be adaptively adjusted to maximize a resistance ratio between when the crystal state of the selector 450 is crystalline and when the crystal state of the selector 450 is non-crystalline, to allow an operating voltage value of the selector 450 to be less than a reference operating voltage value, or to allow a power consumption of the selector 450 to be less than a reference power consumption value.

For example, the composition ratio of the transition metal such as Cr (or Ti, Ni, Zn, Cu, Mo, etc.) in the phase-change material such as Ge and Te may be adjusted to be less than 10% by weight based on Ge and Te and thus, the selector 450 formed of a compound such as CrGeTe or Cr2Ge2Te6 may have an operating voltage of less than 1V, an energy consumption (when a switch is turned-on) of less than 1 pJ, a power consumption ratio of the entire memory device 100 of less than 20%, an on/off ratio of more than $10^4$, an on current (current flowing when the switch is turned-on) of more than 1 MA/cm$^2$, an off current (current flowing when the switch is turned-off) of less than 1 pA, an operating speed of less than 50 ns, and endurance of more than 100 M.

In addition, the selector 450 may change a crystal state of a local region of an area corresponding to the target phase-change layer 441 not an entire area corresponding to the target phase-change layer 441 between crystalline and non-crystalline to be switched between the on state and the off state. Therefore, power consumption and energy consumption may be significantly lowered as described above.

For example, in the selector 450, the composition ratio in which the transition metal is contained in the phase-change material may be adjusted to minimize a size of the local region where the crystal state is changed between crystalline and non-crystalline to less than 20% of the entire region (the entire region corresponding to the target phase-change layer 441 of an entire region of the selector 450). Therefore, the power consumption during a switching operation which is switched between the on state and the off state may be significantly reduced.

In addition, the phase-change memory 400 may further include a tunnel barrier. Detailed description thereof will be described with reference to FIG. 4C.

As described above, the phase-change memory device 400 includes the phase-change layer 440 having the phase-change characteristics and the selector 450 having the reversed phase-change characteristics. Thus, because the selector 450 is set to a high resistance state in both a set operation and a reset operation during a write operation, the region corresponding to the target phase-change layer 441 of the selector 240 is always maintained in an off state and does not need to perform a separate switching off operation.

In detail, the phase-change memory device 400 may perform a set operation of a write operation to have a memory state of binary value [1] in response to the crystal state of the region corresponding to the target phase-change layer 441 of the selector 450 being changed to crystalline to be set to a high resistance state and the crystal state of the target phase-change layer 441 being changed to crystalline to be set to a low resistance state. In addition, the phase-change memory device 400 may perform a reset operation of the write operation to have a memory state of binary value [0] in response to the crystal state of the target phase-change layer 441 of the selector 450 being changed to non-crystalline to be set to a low resistance state and the crystal state of the target phase-change layer 441 being changed to non-crystalline to be set to a high resistance state.

Because either the target phase-change layer 441 or the selector 450 is always set to the high resistance state in both the set operation and the reset operations and the phase-change memory device 400 is set to the high resistance state through a cell in both the set operation and the reset operations, the selector 450 does not need to perform a separate switching off operation. Therefore, power consumption and energy consumption based on a separate switching off operation may be prevented.

In addition, the phase-change memory device 400 may perform a read operation in response to that the selector 450 changes the crystal state of the local region of the area corresponding to the target phase-change layer 441 to be switched between the on state and the off state.

In more detail, the phase-change memory 400 may perform the read operation in response to the crystal state of the local region of the area corresponding to the target phase-change layer 441 being changed from non-crystalline to the crystalline to set to the off state after the selector 450 changes the crystal state of the local region from the crystalline to the non-crystal state to set to the on state.

That is, the phase-change memory 400 according to an embodiment may include the selector 450 which generates the phase-change in the local region of the area corresponding to the target phase-change layer 441 to be switched on or switched off. Therefore, the power consumption and energy consumption for the switching operation may be significantly reduced.

Here, when the crystal state of the target phase-change layer 441 is changed, the selector 450 may block a leakage current through the phase-change layer adjacent to the target phase-change layer 441 of the at least one phase-change layer 440.

The above-described phase-change memory 400 may further include at least one insulating layer 460 which extends in the first direction 411 to be interposed between the at least one phase-change layer 440 and separates the at least one phase-change layer 440 from each other. The at least one insulating layer 460 may be formed of an insulating material such as SiO2.

Figure 4C:
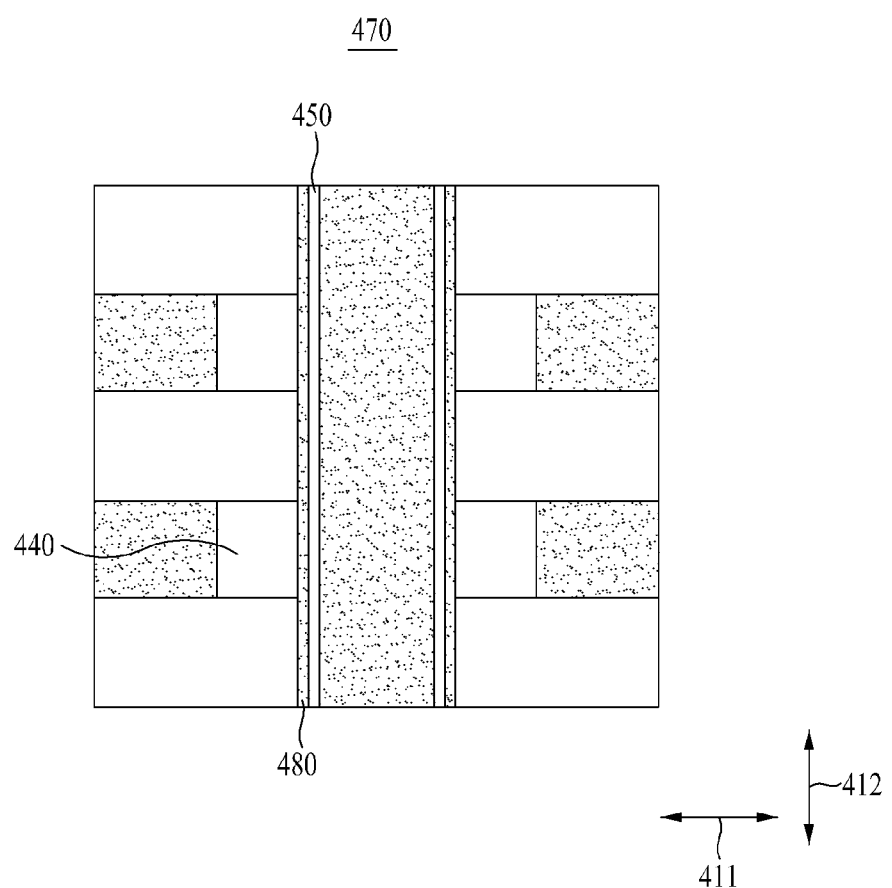
FIG. 4C is a diagram illustrating a phase-change memory having a highly integrated three-dimensional architecture according to another embodiment.

FIG. 4C is a diagram illustrating a phase-change memory having a highly integrated three-dimensional architecture according to another embodiment.

Referring to FIG. 4C, a phase-change memory 470 according to another embodiment is configured in the same manner as the phase-change memory illustrated in FIG. 4B, but is different in that the phase-change memory 470 further includes a tunnel barrier 480.

The tunnel barrier 480 may be formed to extend in the second direction 412 while being disposed between the selector 450 and the at least one phase-change layer 440 included in the phase-change memory 470 to reduce the off current (current flowing when a switch is turned-off) of the selector 450 and to suppress an increase of the voltage (turn-on voltage) when the selector 450 is set to an on state. The tunnel barrier 480 may be formed of SiO2, TiO2, or the like, and may be not defined or limited thereto. In addition, the tunnel barrier 480 may have material and thickness, which decrease the off current of the selector 450, suppress the increase of the turn-on voltage, and optimize the on/off ratio.

Figure 5:
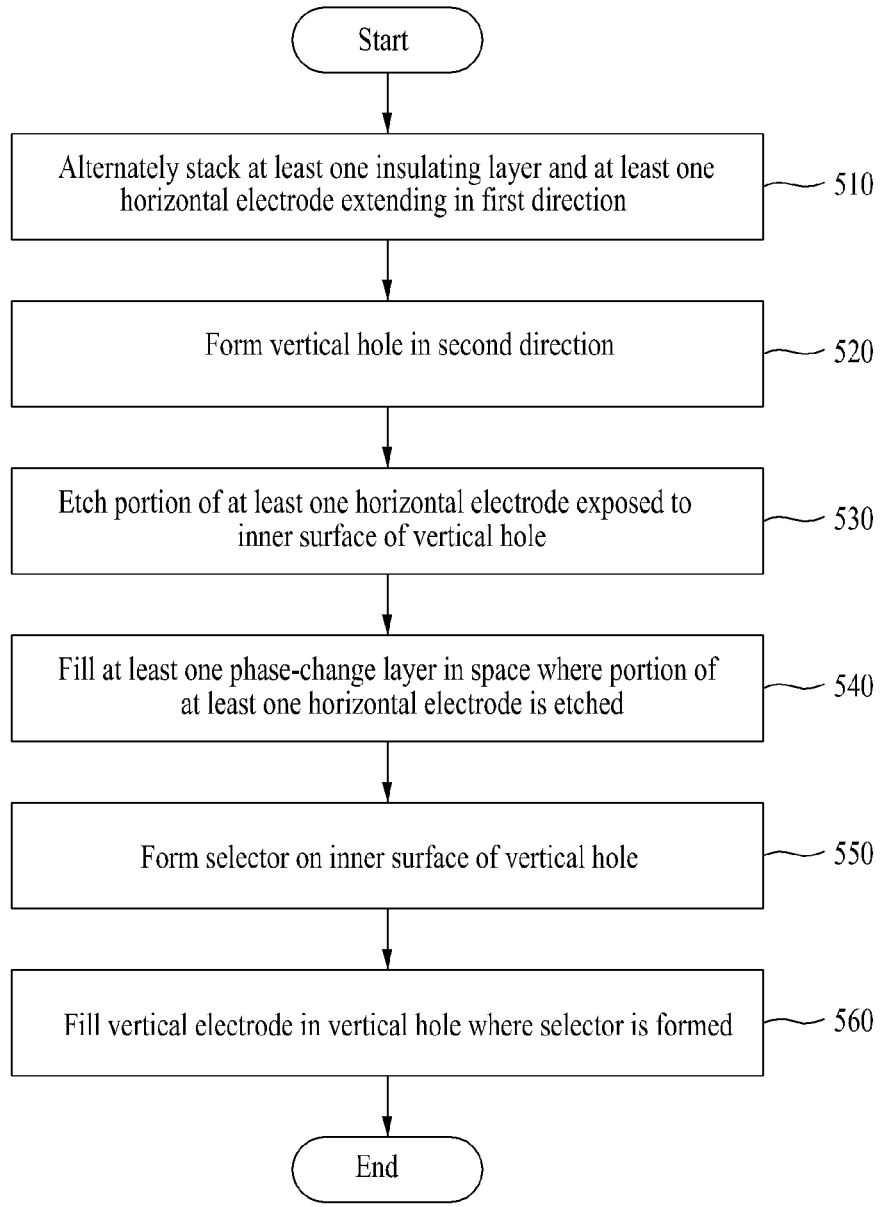
FIG. 5 is a flowchart illustrating a method of manufacturing a phase-change memory according to an embodiment.

FIG. 5 is a flowchart illustrating a method of manufacturing a phase-change memory according to an embodiment and FIGS. 6A to 6F are views sequentially illustrating cross-sections of a phase-change memory for explaining a method of manufacturing a phase-change memory according to an embodiment.

Referring to FIGS. 5 and 6A to 6F, a method of manufacturing a phase-change memory according to an embodiment relates to a method of manufacturing a phase-change memory having a highly integrated three-dimensional architecture described above with reference to FIG. 4B and is performed by a manufacturing system.

Figure 6A:
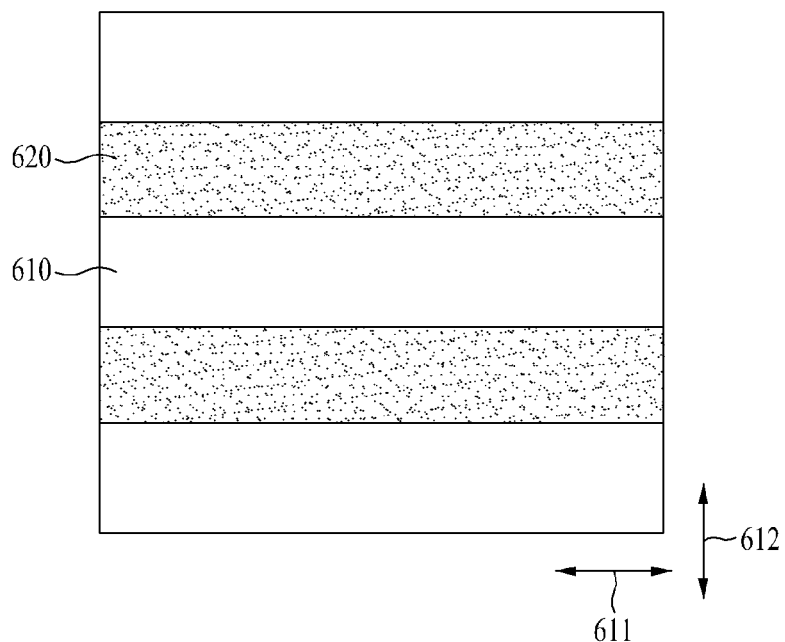
FIGS. 6A to 6F are views sequentially illustrating cross-sections of a phase-change memory for explaining a method of manufacturing a phase-change memory according to an embodiment.

First, as shown in FIG. 6A, the manufacturing system alternately stacks at least one insulating layer 610 and at least one horizontal electrode 620, which are formed extending in a first direction 611, in operation 510. For example, the manufacturing system may alternately stack at least one insulating layer 610 formed of an insulating material such as SiO2 and at least one horizontal electrode 620 formed of a metal material such as W, TaN, TiN, and the like, suitable for the characteristics of a selector 650 described later.

Here, a thickness of each of the at least one insulating layer 610 and the at least one horizontal electrode 620 may be adaptively adjusted depending on characteristics of the phase-change memory to be manufactured.

Figure 6B:
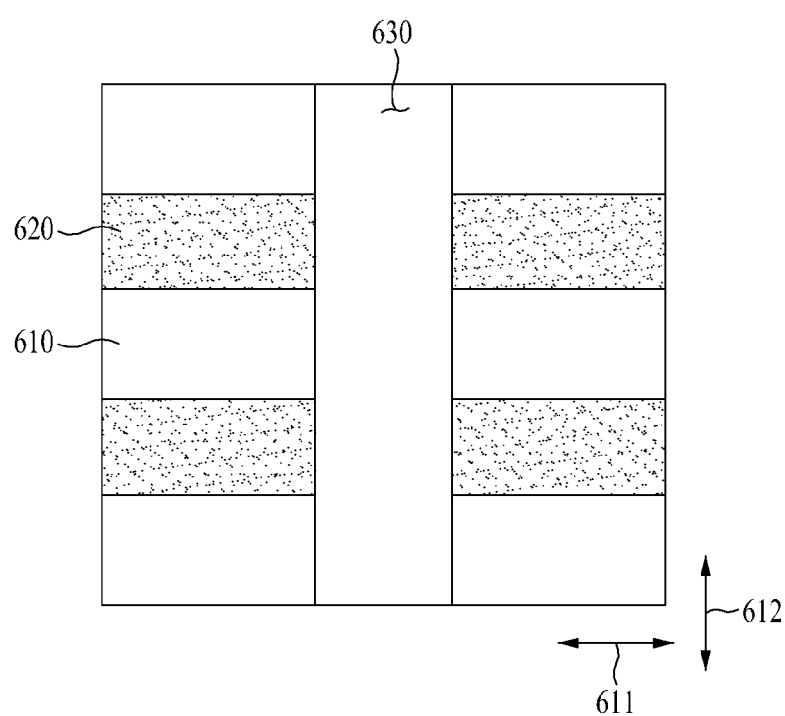

Subsequently, as shown FIG. 6B, the manufacturing system forms a vertical hole 630 through the stacked at least one insulating layer 610 and at least one horizontal electrode 620 in a second direction 612 perpendicular to the first direction 611 in operation 520. For example, the manufacturing system may form a vertical line through the stacked at least one insulating layer 610 and at least one horizontal electrode 620 by etching, fill an insulating line in the vertical line, and then at least partially etch the insulating line to form the vertical hole 630.

Here, the manufacturing system may form the vertical hole 630 in a form of a square pillar to minimize an area in which at least one phase-change layer 640 and the selector 650 is in vertical contact.

Figure 6C:
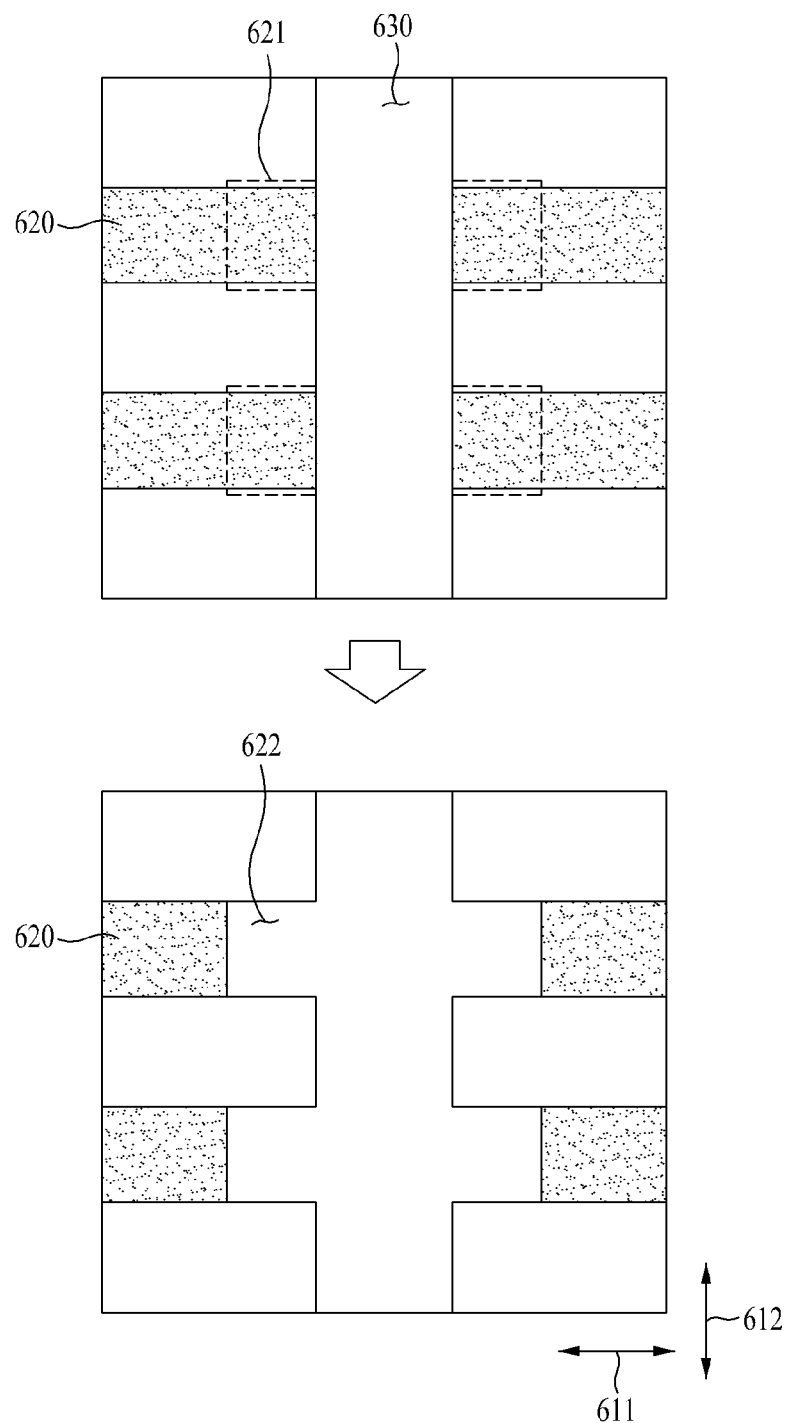

Then, as shown in FIG. 6C, the manufacturing system etches a portion 621 of the at least one horizontal electrode 620 which is exposed to an inner surface of the vertical hole 630 in operation 530. In detail, the manufacturing system may etch a side surface 621 exposed to the inner surface of the vertical hole 630 of the at least one horizontal electrode 620 through the vertical hole 630 to form an empty space 622. For example, the manufacturing system may remove the at least one portion 621 of the at least one horizontal electrode 620 through an isotropic chemical etch process.

Here, the manufacturing system may adjust an etch rate at which the portion 621 of at least one or more horizontal electrodes 620 is etched such that the phase-change memory to be manufactured may perform a multivalued bit/cell operation. This process is performed based on characteristics where a crystallization state of the at least one phase-change layer 640 is changed based on adjustment of a pulse state depending on the etching rate at which the portion 621 of the at least one horizontal electrode 620 is etched. Thus, the more portion 621 of the at least one horizontal electrode 620 is etched, the more bit/cell operations may be performed in the phase-change memory.

Figure 6D:
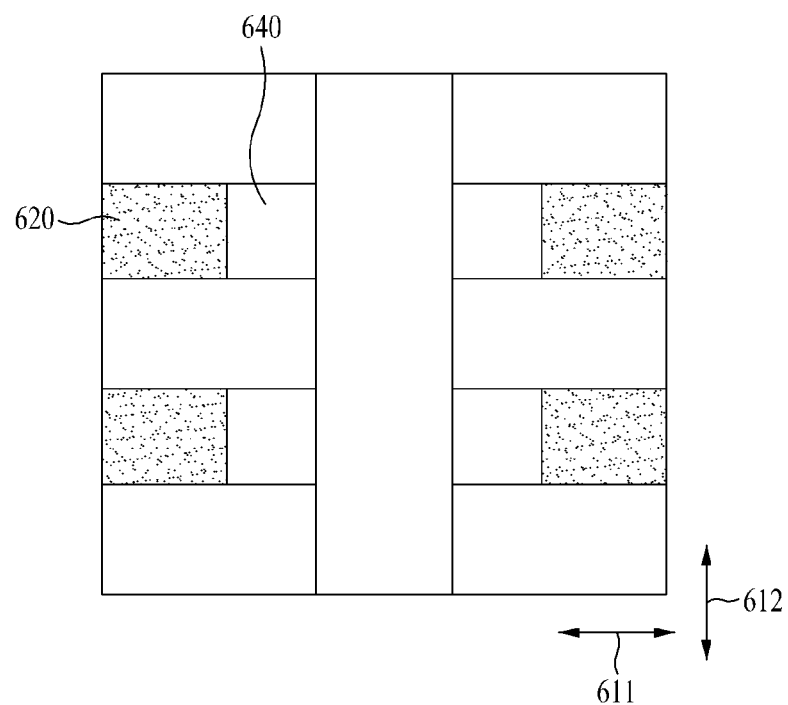

Thereafter, as shown in FIG. 6D, in operation 540, the manufacturing system fills the at least one phase-change layer 640 in the space 622 where the portion 621 of the at least one horizontal electrode 620 is etched. Accordingly, the at least one phase-change layer 640 may extend in the first direction 611.

In detail, the manufacturing system may fill a phase-change material (Ge2Sb2Te5) such as Ge, Sb, and/or Te in the space 622 where the portion 621 of the at least one horizontal electrode 620 is etched to have the phase-change characteristics where the at least one phase-change layer 640 has a low resistance when a crystal state is crystalline and the at least one phase-change layer 640 has a high resistance when the crystal state is non-crystalline.

In particular, the manufacturing system may fill the at least one phase-change layer 640 in the space 622 where the portion 621 of the at least one horizontal electrode 620 is etched using an atomic layer deposition (ALD) technique. For example, the manufacturing system may deposit the at least one phase-change layer 640 in the space 622 where the portion 621 of the at least one horizontal electrode 620 is etched using the ALD which alternates a G-T cycle of combining GeCl2(dioxide) and Te(TES)2 to form GeTe and an S-T cycle of combining SbCl3 and Te(TES)2 to form Sb2Te3. Here, the number of times the G-T cycle and the S-T cycle may be controlled to adjust a composition ratio of the phase-change material forming the at least one phase-change layer 640.

Figure 6E:
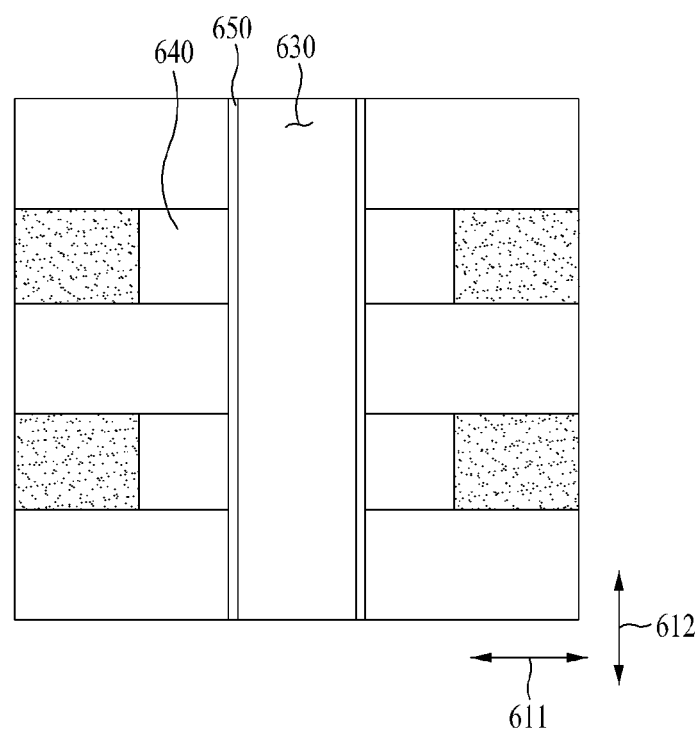

As shown in FIG. 6E, the manufacturing system then forms the selector 650 on the inner surface of the vertical hole 630 to be in contact with the at least one phase-change layer 640, in operation 550. Therefore, the selector 650 may extend in the second direction 612.

Here, the manufacturing system may allow the selector 650 to be formed of a compound containing a transition metal and thus the selector 650 may have the reversed phase-change characteristics (having a high resistance when the crystal state is crystalline and having a low resistance when the crystal state is non-crystalline).

As described above, as the selector 650 is formed of the compound containing the transition metal in the phase-change material, the crystal state may be changed based on 290° C. suitable for a temperature value (on/off temperature value of a selection element to increase a grain size) at which a selection element used in the phase-change memory is turned on/off (the crystal state of the selector 650 is crystallized at 290° C. or more).

In addition, as the selector 650 is formed of the compound containing the transition metal in the phase-change material, contact resistivity may be rapidly increased by crystallization, carrier density may be rapidly decreased, a total resistance of the memory device may be drastically reduced in an initial increase of an non-crystalline fraction, and a current may be rapidly increased as interface resistance decreases, thereby implementing low energy switching.

Here, in operation 550, the manufacturing system may allow the composition ratio in which the transition metal is contained in the phase-change material to be adaptively adjusted to maximize a resistance ratio between when the crystal state of the selector 650 is crystalline and when the crystal state of the selector 650 is non-crystalline, to allow an operating voltage value of the selector 650 to be less than a reference operating voltage value, or to allow a power consumption of the selector 650 to be less than a reference power consumption value.

For example, the composition ratio of the transition metal such as Cr (or Ti, Ni, Zn, Cu, Mo, etc.) in the phase-change material such as Ge and Te may be adjusted to be less than 10% by weight based on Ge and Te and thus, the selector 650 formed of a compound such as CrGeTe or Cr2Ge2Te6 may have an operating voltage of less than 1V, an energy consumption (when a switch is turned-on) of less than 1 pJ, a power consumption ratio of the entire memory device 100 of less than 20%, an on/off ratio of more than $10^4$, an on current (current flowing when the switch is turned-on) of more than 1 MA/cm$^2$, an off current (current flowing when the switch is turned-off) of less than 1 pA, an operating speed of less than 50 ns, and endurance of more than 100 M.

In addition, the selector 650 formed through operation 550 may change a crystal state of a local region of an area corresponding to a target phase-change layer of the at least one phase-change layer 640, not an entire region corresponding to the target phase-change layer of the at least one phase-change layer 640, between crystalline and non-crystalline to be switched between the on state and the off state. Therefore, power consumption and energy consumption may be significantly lowered.

For example, in the selector 650, the composition ratio in which the transition metal is contained in the phase-change material may be adjusted to minimize a size of the local region where the crystal state is changed between crystalline and non-crystalline to less than 20% of the entire region (the entire region corresponding to the target phase-change layer of the entire region of the selector 650). Therefore, the power consumption during a switching operation which is switched between the on state and the off state may be significantly reduced.

Furthermore, in the same manner as the process of forming the at least one phase-change layer 640, in operation 550, the manufacturing system may form the selector 650 on the inner surface of the vertical hole 630 to be in contact with the at least one phase-change layer 640 using the ALD technique. In addition, the manufacturing system may deposit Ge—Te/Te in a form of a superlattice and then perform a heat treatment in an atmosphere of a Cr source or may deposit Ge—Te/Cr/Te in a form of a superlattice and then perform a heat treatment to form the selector 650 on the inner surface of the vertical hole 630 to be in contact with the at least one phase-change layer 640.

In addition, in operation 550, when the crystal state of the target phase-change layer of the at least one phase-change layer 640 is changed in the manufactured phase-change memory, the manufacturing system may form the selector 650 to block a leakage current to another adjacent phase-change layer and to suppress a thermal effect between the target phase-change layer and another adjacent phase-change layer.

Although not shown, in operation 550, the manufacturing system may further perform a process of forming a tunnel barrier to reduce the off current of the selector 650 in the manufactured phase-change memory. In this case, the manufacturing system may form the tunnel barrier on the inner surface of the vertical hole 630 to be in contact with the at least one phase-change layer 640 and then form the selector 650 on the inner surface of the vertical hole 630 in which the tunnel barrier is formed to be in contact with the tunnel barrier.

Figure 6F:
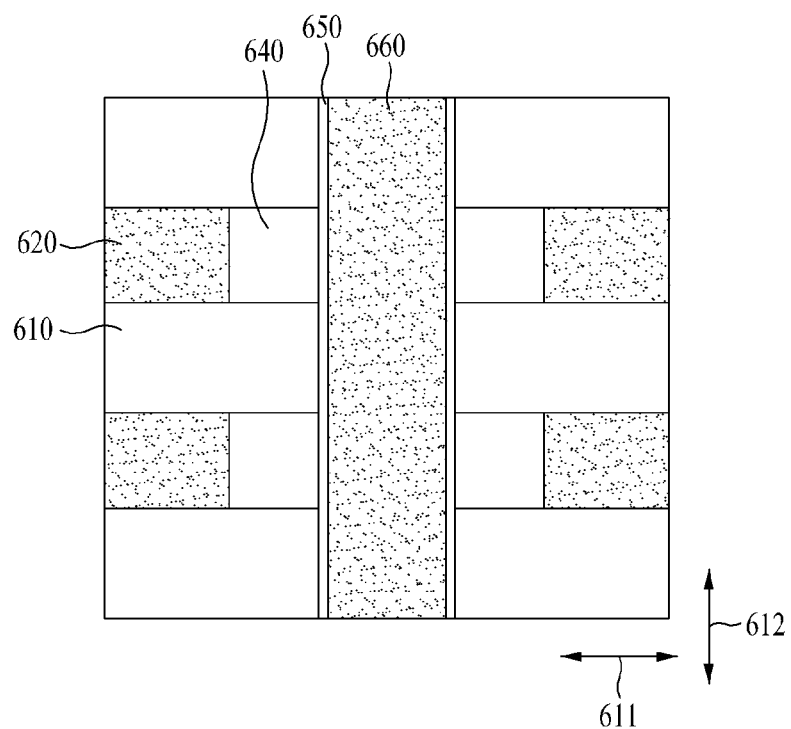

Thereafter, as shown in FIG. 6F, the manufacturing system fills a vertical electrode 660 in the vertical hole 630 where the selector 650 is formed in operation 560. Therefore, the vertical electrode 660 may extend in the second direction 612.

For example, the manufacturing system may fill the vertical electrode 660 with a metal material, such as W, TaN, TiN, or the like, suitable for the characteristics of the selector 650.

As described above, the method of manufacturing the phase-change memory of the structure including the at least one insulating layer 610, the at least one horizontal electrode 620, the at least one phase-change layer 640, the selector 650, and the vertical electrode 660 (the phase-change memory having a structure further including the tunnel barrier when the tunnel barrier is further formed in operation 550) has been described, but is not defined or limited thereto. The manufacturing system according to an embodiment may perform a variety of manufacturing methods including operations for manufacturing the phase-change memory of various structures including essentially the at least one phase-change layer 640 and the selector 650.

Also, it has been described that the phase-change memory is manufactured to have a stack structure in which the at least one phase-change layer 640 is stacked in plurality, but is not defined or limited thereto. The at least one phase-change layer 640 may be formed in a non-stack structure in which one phase-change layer 640 is stacked.

Figure 7:
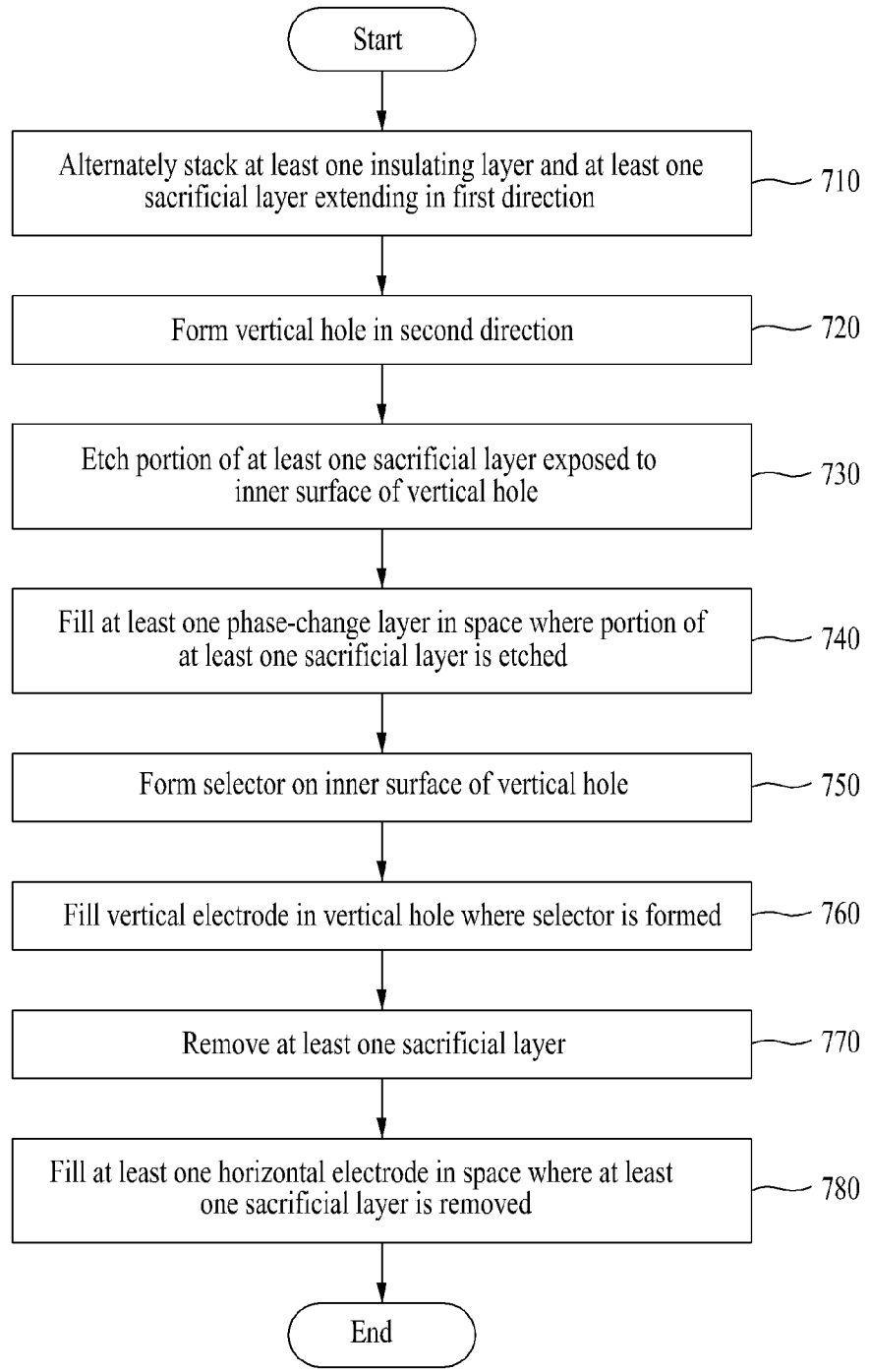
FIG. 7 is a flow chart illustrating a method of manufacturing a phase-change memory according to another embodiment.

FIG. 7 is a flow chart illustrating a method of manufacturing a phase-change memory according to another embodiment and FIGS. 8A to 8H are views sequentially illustrating cross-sections of a phase-change memory for explaining a method of manufacturing a phase-change memory according to another embodiment.

Referring to FIGS. 7, and 8A to 8H, a method of manufacturing a phase-change memory according to another embodiment relates to a method of manufacturing a phase-change memory having a highly integrated three-dimensional architecture described above with reference to FIG. 4B and is performed by a manufacturing system.

In particular, the manufacturing method of the phase-change memory according to another embodiment is similar to the manufacturing method of the phase-change memory described above with reference to FIGS. 5, and 6A to 6F, but there is a difference in that at least one horizontal electrode is formed in a post process using at least one sacrificial layer to lower process difficulty.

Figure 8A:
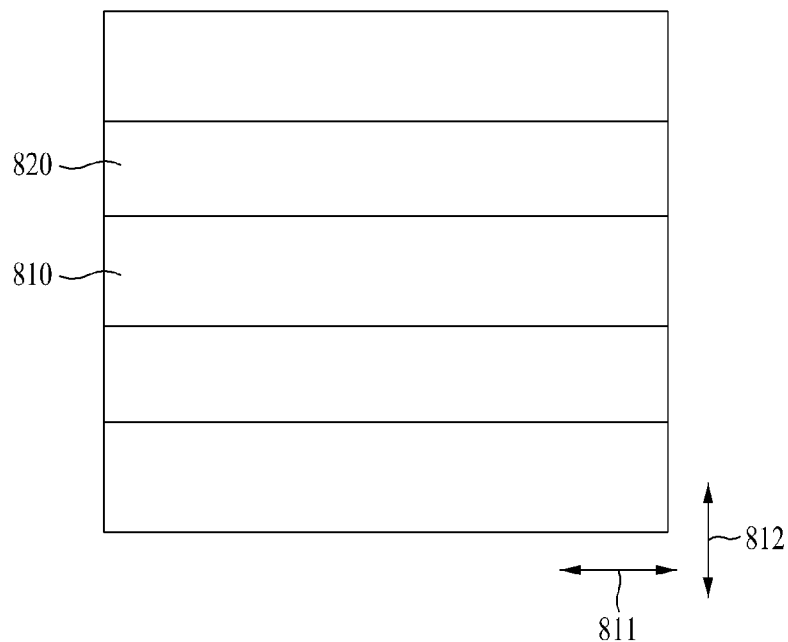

First, as shown in FIG. 8A, the manufacturing system alternately stacks at least one insulating layer 810 and at least one sacrificial layer 820 extending in a first direction 811 in operation 710. For example, the manufacturing system may alternately stack at least one insulating layer 810 formed of an insulating material such as SiO2 and at least one sacrificial layer 820 formed of a material such as Si3N4.

Here, a thickness of each of the at least one insulating layer 810 and the at least one sacrificial layer 820 may be adaptively adjusted depending on characteristics of the phase-change memory to be manufactured.

Figure 8B:
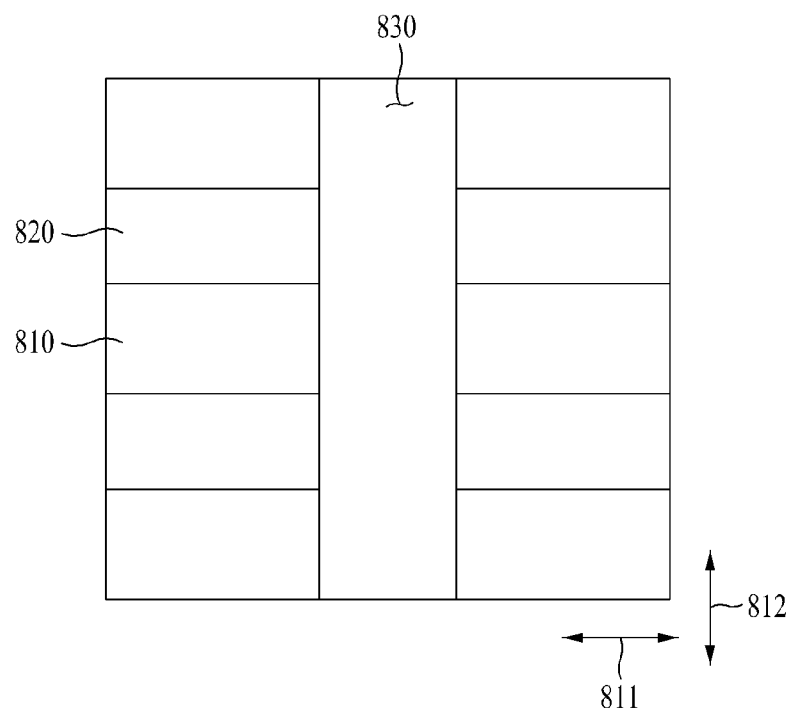

Subsequently, as shown in FIG. 8B, the manufacturing system forms a vertical hole 830 through the stacked at least one insulating layer 810 and the at least one sacrificial layer 820 in a second direction 812 perpendicular to the first direction 811 in operation 720. For example, the manufacturing system may form a vertical line through the stacked at least one insulating layer 810 and at least one sacrificial layer 820 by etching, fill an insulating line in the vertical line, and then at least partially etch the insulating line to form the vertical hole 830.

Here, the manufacturing system may form the vertical hole 830 in a form of a square pillar to minimize an area in which at least one phase-change layer 840 and a selector 850 is in vertical contact.

Figure 8C:
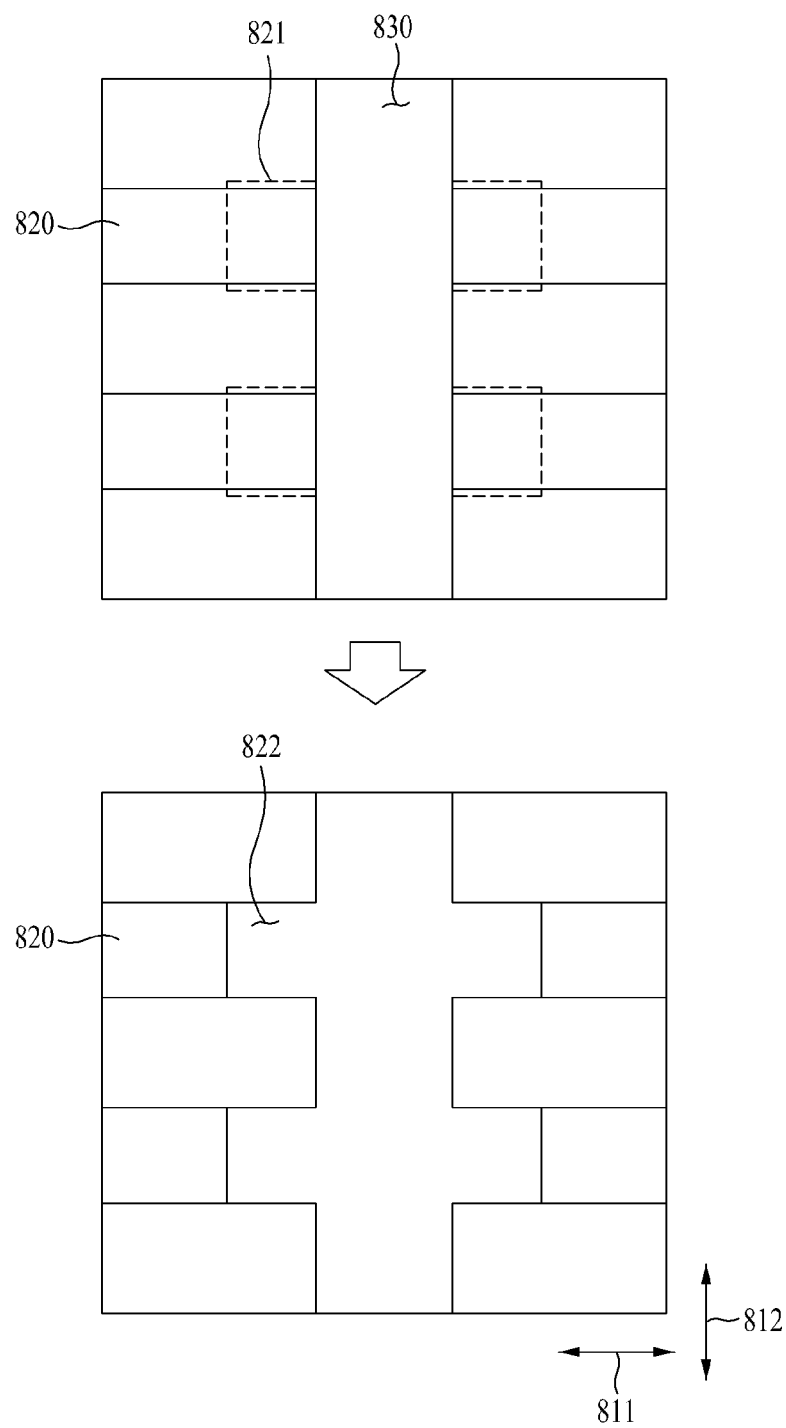

Then, as shown in FIG. 8C, the manufacturing system etches a portion 821 of the at least one sacrificial layer 820 which is exposed to an inner surface of the vertical hole 830 in operation 730. In detail, the manufacturing system may etch a side surface 821 exposed to the inner surface of the vertical hole 830 of the at least one sacrificial layer 820 through the vertical hole 830 to form an empty space 822. For example, the manufacturing system may remove the at least one portion 821 of the at least one sacrificial layer 820 through an isotropic chemical etch process.

Here, the manufacturing system may adjust an etch rate at which the portion 821 of at least one or more sacrificial layers 820 is etched such that the phase-change memory being manufactured may perform a multivalued bit/cell operation. This process is performed based on characteristics where a crystallization state of the at least one phase-change layer 840 is changed based on adjustment of a pulse state depending on the etching rate at which the portion 821 of the at least one sacrificial layer 820 is etched. Thus, the more portion 821 of the at least one sacrificial layer 820 is etched, the more bit/cell operations may be performed in the phase-change memory.

Figure 8D:
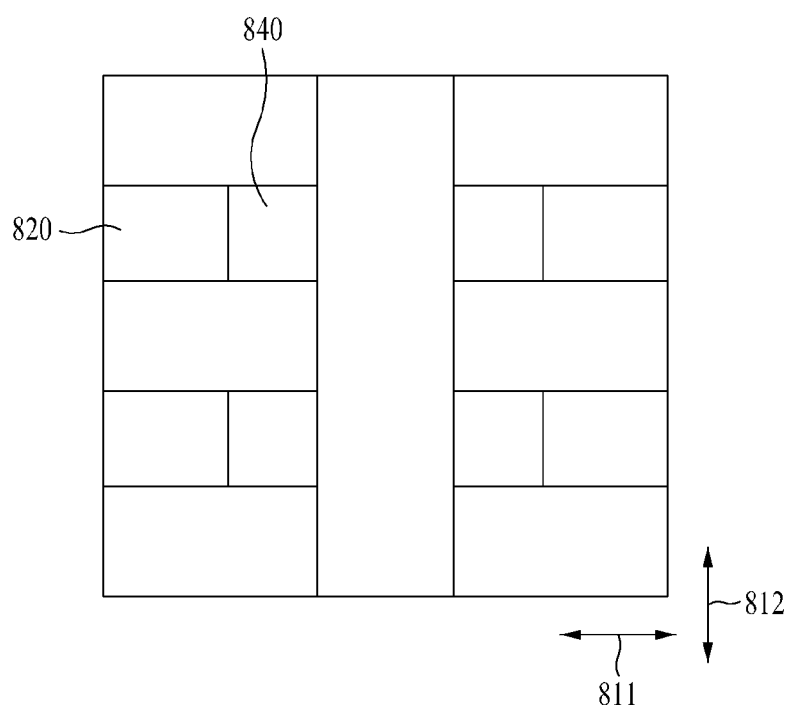

Thereafter, as shown in FIG. 8D, in operation 740, the manufacturing system fills the at least one phase-change layer 840 in the space 822 where the portion 821 of the at least one sacrificial layer 820 is etched. Accordingly, the at least one phase-change layer 840 may extend in the first direction 811.

In detail, the manufacturing system may fill a phase-change material (Ge2Sb2Te5) such as Ge, Sb, and/or Te in the space 822 where the portion 821 of the at least one sacrificial layer 820 is etched to have the phase-change characteristics where the at least one phase-change layer 840 has a low resistance when a crystal state is crystalline and the at least one phase-change layer 840 has high resistance when the crystal state is non-crystalline.

In particular, the manufacturing system may fill the at least one phase-change layer 840 in the space 822 where the portion 821 of the at least one sacrificial layer 820 is etched using an atomic layer deposition (ALD) technique. For example, the manufacturing system may deposit the at least one phase-change layer 840 in the space 822 where the portion 821 of the at least one sacrificial layer 820 is etched using the ALD which alternates a G-T cycle of combining GeCl2(dioxide) and Te(TES)2 to form GeTe and an S-T cycle of combining SbCl3 and Te(TES)2 to form Sb2Te3. Here, the number of times the G-T cycle and the S-T cycle may be controlled to adjust a composition ratio of the phase-change material forming the at least one phase-change layer 840.

As shown in FIG. 8E, the manufacturing system then forms a selector 850 on the inner surface of the vertical hole 830 to be in contact with the at least one phase-change layer 840, in operation 750. Therefore, the selector 850 may extend in the second direction 812.

Here, the manufacturing system may allow the selector 850 to be formed of a compound containing a transition metal and thus the selector 850 may have the reversed phase-change characteristics (having a high resistance when the crystal state is crystalline and having a low resistance when the crystal state is non-crystalline).

As described above, as the selector 850 is formed of the compound containing the transition metal in the phase-change material, the crystal state may be changed based on 290° C. suitable for a temperature value (on/off temperature value of a selection element to increase a grain size) at which a selection element used in the phase-change memory is turned on/off (the crystal state of the selector 850 is crystallized at 290° C. or more).

In addition, as the selector 850 is formed of the compound containing the transition metal in the phase-change material, contact resistivity may be rapidly increased by crystallization, carrier density may be rapidly decreased, a total resistance of the memory device may be drastically reduced in an initial increase of an non-crystalline fraction, and a current may be rapidly increased as interface resistance decreases, thereby implementing low energy switching.

Here, in operation 750, the manufacturing system may allow the composition ratio in which the transition metal is contained in the phase-change material to be adaptively adjusted to maximize a resistance ratio between when the crystal state of the selector 850 is crystalline and when non-crystalline, to allow an operating voltage value of the selector 850 to be less than a reference operating voltage value, or to allow a power consumption of the selector 850 to be less than a reference power consumption value.

For example, the composition ratio of the transition metal such as Cr (or Ti, Ni, Zn, Cu, Mo, etc.) in the phase-change material such as Ge and Te may be adjusted to be less than 10% by weight based on Ge and Te and thus, the selector 650 formed of a compound such as CrGeTe or Cr2Ge2Te6 may have an operating voltage of less than 1V, an energy consumption (when a switch is turned-on) of less than 1 pJ, a power consumption ratio of the entire memory device 100 of less than 20%, an on/off ratio of more than $10^4$, an on current (current flowing when the switch is turned-on) of more than 1 MA/cm$^2$, an off current (current flowing when the switch is turned-off) of less than 1 pA, an operating speed of less than 50 ns, and endurance of more than 100 M.

In addition, the selector 850 formed through operation 750 may change a crystal state of a local region of an area corresponding to a target phase-change layer of the at least one phase-change layer 840, not an entire region corresponding to the target phase-change layer of the at least one phase-change layer 840, between crystalline and non-crystalline to be switched between the on state and the off state. Therefore, power consumption and energy consumption may be significantly lowered.

For example, in the selector 850, the composition ratio in which the transition metal is contained in the phase-change material may be adjusted to minimize a size of the local region where the crystal state is changed between crystalline and non-crystalline to less than 20% of the entire region (the entire region corresponding to the target phase-change layer of the entire region of the selector 850). Therefore, the power consumption during a switching operation which is switched between the on state and the off state may be significantly reduced.

Furthermore, in the same manner as the process of forming the at least one phase-change layer 840, in operation 750, the manufacturing system may form the selector 850 on the inner surface of the vertical hole 830 to be in contact with the at least one phase-change layer 840 using the ALD technique. In addition, the manufacturing system may deposit Ge—Te/Te in a form of a superlattice and then perform a heat treatment in an atmosphere of a Cr source or may deposit Ge—Te/Cr/Te in a form of a superlattice and then perform a heat treatment to form the selector 850 on the inner surface of the vertical hole 830 to be in contact with the at least one phase-change layer 840.

In addition, in operation 750, when the crystal state of the target phase-change layer of the at least one phase-change layer 840 is changed in the manufactured phase-change memory, the manufacturing system may form the selector 850 to block a leakage current to another adjacent phase-change layer and to suppress a thermal effect between the target phase-change layer and another adjacent phase-change layer.

Although not shown, in operation 750, the manufacturing system may further perform a process of forming a tunnel barrier to reduce the off current of the selector 850 in the manufactured phase-change memory. In this case, the manufacturing system may form the tunnel barrier on the inner surface of the vertical hole 830 to be in contact with the at least one phase-change layer 840 and then form the selector 850 on the inner surface of the vertical hole 830 in which the tunnel barrier is formed to be in contact with the tunnel barrier.

Figure 8F:
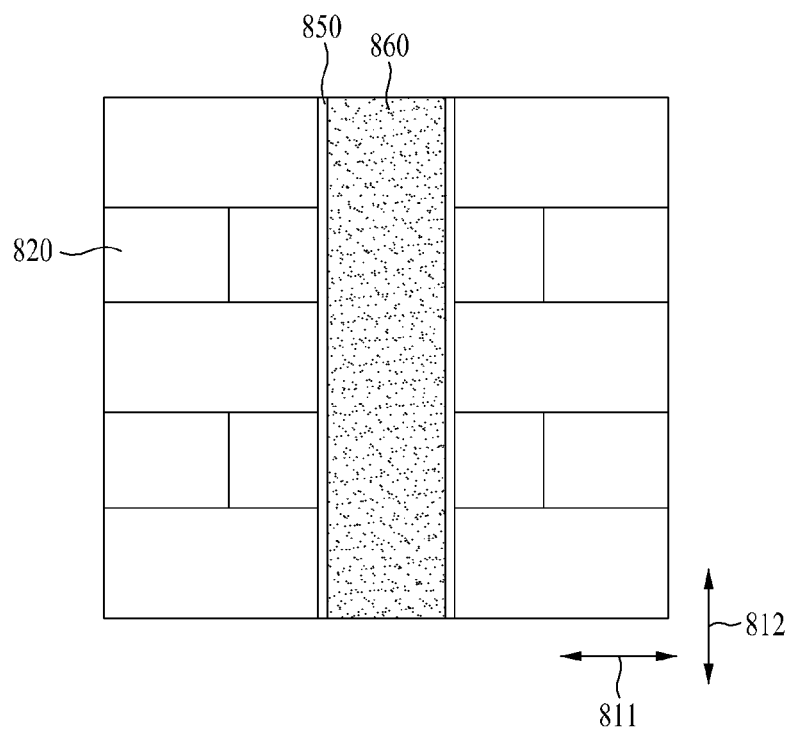

Thereafter, as shown in FIG. 8F, the manufacturing system fills a vertical electrode 860 in the vertical hole 830 in which the selector 850 is formed in operation 760. Therefore, the vertical electrode 860 may extend in the second direction 812.

For example, the manufacturing system may fill the vertical electrode 860 with a metal material, such as W, TaN, TiN, or the like, suitable for the characteristics of the selector 850.

Figure 8G:
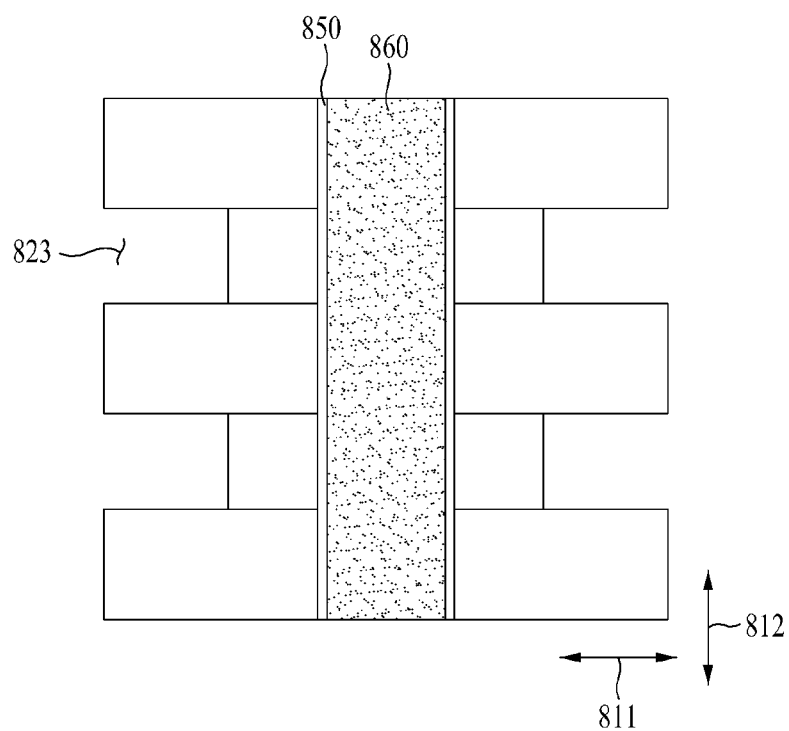

Thereafter, as shown in FIG. 8G, the manufacturing system removes the at least one sacrificial layer 820 in operation 770. In removing the at least one sacrificial layer 820, a general technique of removing a sacrificial layer formed of a material such as Si3N4 may be used.

Figure 8H:
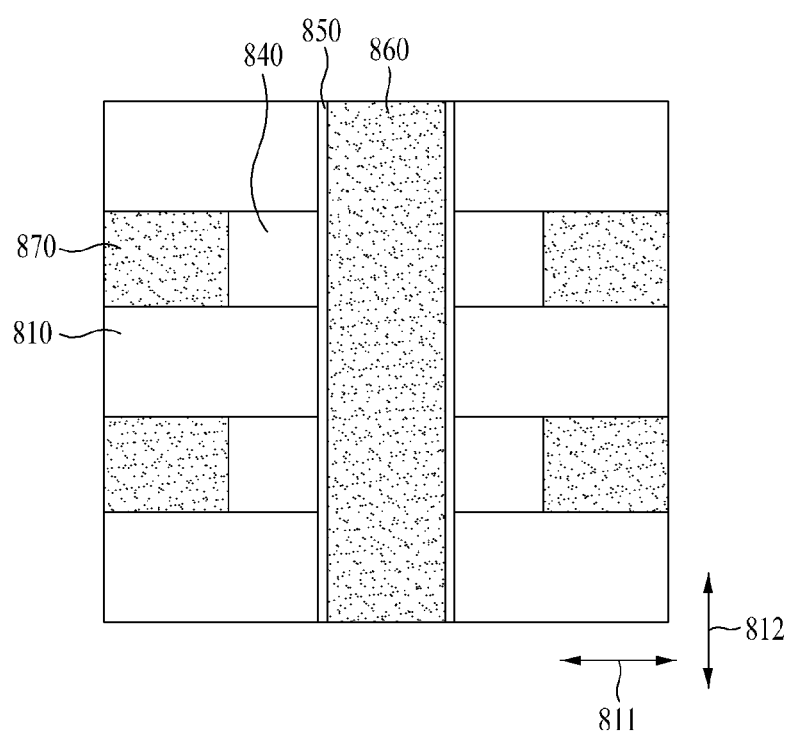

Then, as shown in FIG. 8H, the manufacturing system fills at least one horizontal electrode 870 in a space 823 from which the at least one sacrificial layer 820 is removed in operation 780. For example, the manufacturing system may fill the at least horizontal electrode 870 with a metal material, such as W, TaN, TiN, or the like, suitable for the characteristics of the selector 850 in the space 823 from which the at least one sacrificial layer 820 is removed.

As described above, the method of manufacturing the phase-change memory including the at least one horizontal electrode 870, the at least one phase-change layer 840, the selector 850, and the vertical electrode 860 (the phase-change memory having a structure further including the tunnel barrier when the tunnel barrier is further formed in operation 750) has been described, but is not defined or limited thereto. The manufacturing system according to another embodiment may perform a variety of manufacturing methods including operations for manufacturing the phase-change memory of various structures including essentially the at least one phase-change layer 840 and the selector 850.

Also, it has been described that the phase-change memory is manufactured to have a stack structure in which the at least one phase-change layer 840 is stacked in plurality, but is not defined or limited thereto. The at least one phase-change layer 840 may be formed in a non-stack structure in which one phase-change layer 840 is stacked.

Figure 9A:
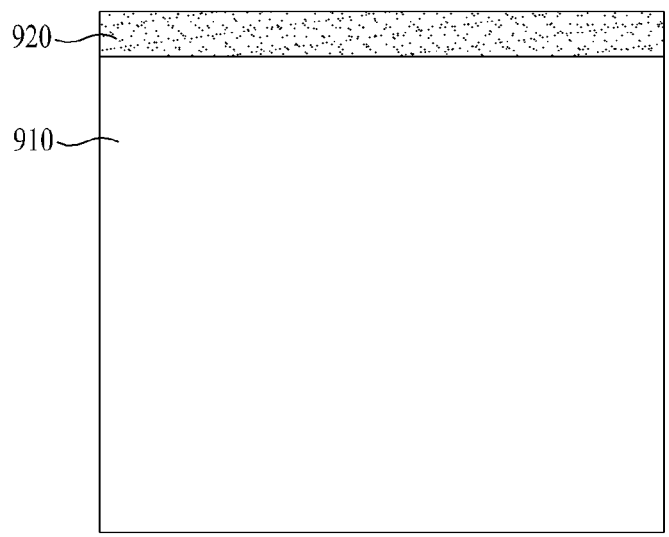
FIG. 9A is a view illustrating a phase-change memory device including a phase-change layer formed of a compound containing a transition metal in a phase-change material.

FIG. 9A is a view illustrating a phase-change memory device including a phase-change layer formed of a compound containing a transition metal in a phase-change material.

Referring to FIG. 9A, a phase-change memory device 900 according to an embodiment includes an upper electrode (not shown) and a lower electrode (not shown) and a phase-change layer 910, and a tunnel barrier 920.

Here, the phase-change layer 910 may be used as a memory layer which changes a crystal state by heat supplied through the upper electrode and the lower electrode.

In particular, the phase-change layer 910 in the same manner as the selector illustrated in FIGS. 1A to 8H is formed of a compound containing a transition metal in a phase-change material to have reversed phase-change characteristics (having a high resistance when a crystal state is crystalline, having a low resistance when the crystal state is non-crystalline). Here, having the high resistance when the crystal state of the phase-change layer 910 is crystalline means that having a relatively high resistance based on resistance when the crystal state is non-crystalline. Also, having a low resistance when the crystal state of the at least one phase-change layer 910 is non-crystalline means that having a relatively low resistance based on resistance when the crystal state is crystalline. That is, having high resistance or low resistance depending on the crystal state of the at least one phase-change layer 910 means that a value of the resistance compared with each other is high or low.

In addition, as the phase-change layer 910 is formed of the compound containing the transition metal in the phase-change material, contact resistivity may be rapidly increased by crystallization, carrier density may be rapidly decreased, a total resistance of the phase-change memory device 900 may be drastically reduced in an initial increase of an non-crystalline fraction, and a current may be rapidly increased as interface resistance decreases, thereby implementing low energy switching.

Here, a composition ratio in which the transition metal is contained in the phase-change material may be adaptively adjusted to maximize a resistance ratio between when the crystal state of the phase-change layer 910 is crystalline and when the crystal state of the phase-change layer 910 is non-crystalline, to allow an operating voltage value of the phase-change layer 910 to be less than a reference operating voltage value, or to allow a power consumption of the phase-change layer 910 to be less than a reference power consumption value.

For example, the composition ratio of the transition metal such as Cr (or Ti, Ni, Zn, Cu, Mo, etc.) in the phase-change material such as Ge and Te may be adjusted to be less than 10% by weight based on Ge and Te and thus, the phase-change layer 910 formed of a compound such as CrGeTe or Cr2Ge2Te6 may have an operating voltage of less than 1V.

In addition, the composition ratio of the phase-change layer 910 may be adjusted to have a read voltage and a write voltage at a value less than a breakdown voltage of the tunnel barrier 920. For example, when the breakdown voltage of the tunnel barrier 920 is 5V, the composition ratio of the phase-change layer 910 may be adjusted to allow the read voltage of the phase-change layer 910 to be 1V and to allow the write voltage to be 2 to 3V.

Also, the phase-change layer 910 may allow a contact resistivity to be adjusted based on a material forming either the upper electrode or the lower electrode. Thus, a bulk resistance may also be determined as the contact resistivity is adjusted.

The tunnel barrier 920 may be disposed between any one of the upper electrode and the lower electrode and the phase-change layer 910 and may be formed of $SiO_2$ or $TiO_2$, but is not defined or limited to the above-described materials. Also, the tunnel barrier 920 may have various materials and thicknesses, which are physically and chemically shielded between any one of the upper electrode and the lower electrode and the phase-change layer 910 to prevent inter-diffusion and allow tunneling current to flow between any one of the upper electrode and the lower electrode and the phase-change layer 910 through a tunneling effect of electrons. A blocking layer having a specific thickness or less (e.g., a blocking layer having a thickness of 5 nm or less) may be used as the tunnel barrier 920.

The above-described phase-change memory device 900 may perform a set operation of a write operation to have a memory state of binary value [1] in response to the crystal state of the phase-change layer 910 being changed to crystalline to be set to a high resistance state. In addition, the phase-change memory device 900 may perform a reset operation of a write operation to have a memory state of binary value [0] in response to the crystal state of the phase-change layer 910 being changed to non-crystalline to be set to a low resistance state.

In addition, the phase-change memory device 900 may perform a read operation as a voltage lower than the voltage applied in the above-described write operation is applied. For example, the above-described write operation of the set or reset may be performed as a voltage of 2 to 3V is applied, and the read operation may be performed as a voltage of 1V is applied.

As described above, the voltages applied during the write operation and the read operation may be set differently from each other within a range below the breakdown voltage of the tunnel barrier 920. The tunnel barrier 920 may reduce an off current of the phase-change layer 910 and suppress an increase of voltage when the phase-change layer 910 is set to an on state to secure Schottky diode characteristics. Therefore, the phase-change memory device 900 may not require a separate switching element. That is, as the tunnel barrier 920 functions as a switching element, the phase-change memory device 900 may not require a separate switching element. However, the present invention is not defined or limited thereto, and the phase-change memory device 900 may further include an OTS for selectively switching heat supplied by the upper electrode and the lower electrode to the phase-change layer 910. Here, the phase-change memory device 900 may have a structure in which the OTS, the tunnel barrier 920, and the phase-change layer 910 are sequentially stacked between the upper electrode and the lower electrode.

As described above, the phase-change memory device 900 has been described as including the tunnel barrier 920, but is not defined or limited thereto and may be configured to include only the phase-change layer 910 not including the tunnel barrier 920. Here, a Schottky barrier may be formed between any one of the upper electrode or the lower electrode and the phase-change layer 910 due to a work function. For example, a unidirectional Schottky barrier (or bidirectional Schottky) may be formed between the upper electrode (or the lower electrode) and the phase-change layer 910 to block the off current of the phase-change layer 910. Here, either the upper electrode or the lower electrode may be formed of material (e.g., tungsten, cobalt, or nickel) and thickness suitable for securing Schottky diode characteristics.

In addition, a phase-change memory having a highly integrated three-dimensional architecture may be implemented based on the phase-change memory device 900. Detailed description thereof will be described with reference to FIG. 9B.

Figure 9B:
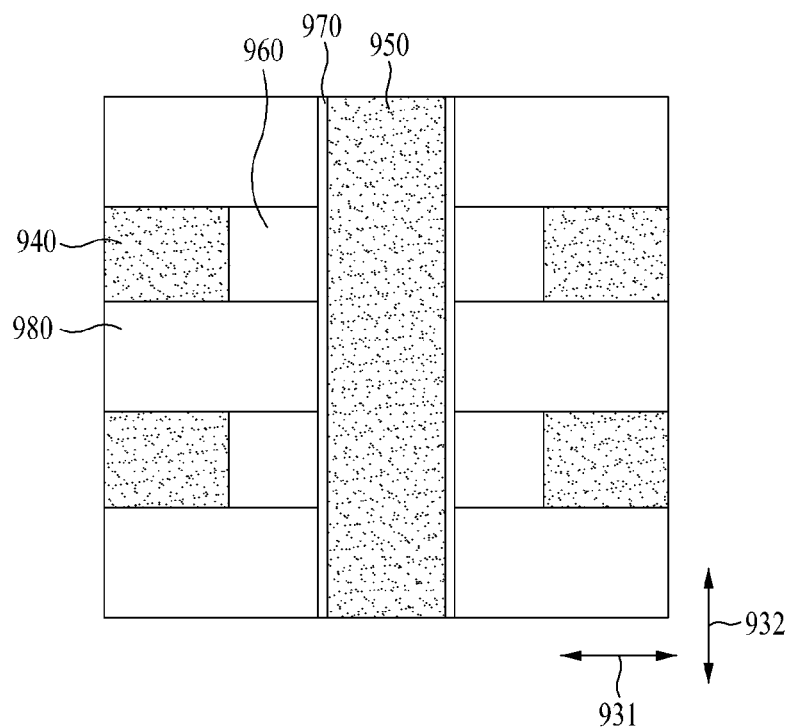
FIG. 9B is a diagram illustrating a phase-change memory based on a phase-change layer formed of a compound containing a transition metal in a phase-change material.

FIG. 9B is a diagram illustrating a phase-change memory based on a phase-change layer formed of a compound containing a transition metal in a phase-change material.

Referring to FIG. 9B, a phase-change memory 930 having a highly integrated three-dimensional architecture according to an embodiment may include at least one horizontal electrode 940 extending in a first direction 931 and a vertical electrode 950 extending in a second direction 932 perpendicular to the first direction 931, at least one phase-change layer 960 extending in the first direction 931 to be in contact with the at least one horizontal electrode 940, respectively, and a tunnel barrier 970 extending in the second direction 932 to be in contact with the at least one phase-change layer 960 and the vertical electrode 950, respectively.

Hereinafter, the at least one horizontal electrode 940 may correspond to the upper electrode described above with reference to FIG. 9A, and the vertical electrode 950 may correspond to the lower electrode described above with reference to FIG. 9A. Accordingly, the at least one phase-change layer 960 and the tunnel barrier 970 described later may correspond to the phase-change layer and the tunnel barrier described above with reference to FIG. 9A, respectively.

Each of the at least one horizontal electrode 940 and the vertical electrode 950 may be formed of a metal material, such as W, TaN, TiN, and the like, suitable for characteristics of the phase-change layer 960 described later. Here, the at least one horizontal electrode 940 may be grounded to ground.

The at least one phase-change layer 960 is formed of a phase-change material to change a crystal state by heat (heat caused by current flow or applied voltage difference between the at least one horizontal electrode 940 and the vertical electrode 950) supplied between the at least one horizontal electrode 940 and the vertical electrode 950.

For example, the at least one phase-change layer 960 may be formed of a compound containing a transition metal in a phase-change material to have reversed phase-change characteristics (having a high resistance when a crystal state is crystalline, having a low resistance when the crystal state is non-crystalline). Here, having a high resistance when the crystal state of the phase-change layer 960 is crystalline means that having a relatively high resistance based on resistance when the crystal state is non-crystalline. Also, having a low resistance when the crystal state of the at least one phase-change layer 960 is non-crystalline means that having a relatively low resistance based on resistance when the crystal state is crystalline. That is, having high resistance or low resistance depending on the crystal state of the at least one phase-change layer 960 means that a value of the resistance compared with each other is high or low.

In addition, as the phase-change layer 960 is formed of the compound containing the transition metal in the phase-change material, contact resistivity may be rapidly increased by crystallization, carrier density may be rapidly decreased, a total resistance of the phase-change memory 930 may be drastically reduced in an initial increase of an non-crystalline fraction, and a current may be rapidly increased as interface resistance decreases, thereby implementing low energy switching.

Here, a composition ratio in which the transition metal is contained in the phase-change material may be adaptively adjusted to maximize a resistance ratio between when the crystal state of the phase-change layer 960 is crystalline and when the crystal state of the phase-change layer 960 is non-crystalline, to allow an operating voltage value of the phase-change layer 960 to be less than a reference operating voltage value, or to allow a power consumption of the phase-change layer 960 to be less than a reference power consumption value.

For example, the composition ratio of the transition metal such as Cr (or Ti, Ni, Zn, Cu, Mo, etc.) in the phase-change material such as Ge and Te may be adjusted to be less than 10% by weight based on Ge and Te and thus, the phase-change layer 960 formed of a compound such as CrGeTe or $Cr_2Ge_2Te_6$ may have an operating voltage of less than 1V.

In addition, the composition ratio of the phase-change layer 960 may be adjusted to have a read voltage and a write voltage at a value less than a breakdown voltage of the tunnel barrier 970. For example, when the breakdown voltage of the tunnel barrier 970 is 5V, the composition ratio of the phase-change layer 960 may be adjusted to allow the read voltage of the phase-change layer 960 to be 1V and to allow the write voltage to be 2 to 3V.

Also, the phase-change layer 960 may allow a contact resistivity to be adjusted based on a material forming either the upper electrode or the lower electrode. Thus, a bulk resistance may also be determined as the contact resistivity is adjusted.

The tunnel barrier 970 may extend in the second direction 932 while being disposed between the vertical electrode 950 and the at least one phase-change layer 960 included in the phase-change memory 930 may be formed of $SiO_2$ or $TiO_2$, but is not defined or limited to the above-described materials. Also, the tunnel barrier 970 may have various materials and thicknesses, which are physically and chemically shielded between any one of the upper electrode and the lower electrode and the phase-change layer 960 to prevent inter-diffusion and allow tunneling current to flow between any one of the upper electrode and the lower electrode and the phase-change layer 960 through a tunneling effect of electrons. A blocking layer having a specific thickness or less (e.g., a blocking layer having a thickness of 5 nm or less) may be used as the tunnel barrier 970.

The phase-change memory 930 may change the crystal state of the target phase-change layer of the at least one phase-change layer 960 to crystalline, may allow the target phase-change layer to be set to a high resistance state, and may perform a set operation of a write operation to have a memory state of binary value [1]. In addition, the phase-change memory 930 may perform a reset operation of the write operation to have a memory state of binary value [0] in response to the crystal state of the target phase-change layer of the at least one phase-change layer 960 being changed to non-crystalline to be set to a low resistance state.

In addition, the phase-change memory 930 may perform a read operation as a voltage lower than the voltage applied in the above-described write operation. For example, the above-described write operation of the set or reset may be performed as a voltage of 2 to 3V is applied, and the read operation may be performed as a voltage of 1V is applied.

As described above, the voltages applied during the write operation and the read operation may be set differently from each other within a range below the breakdown voltage of the tunnel barrier 970. Therefore, the phase-change memory 930 may not require a separate switching element. However, the present invention is not defined or limited thereto, and the phase-change memory 930 may further include an OTS for selectively switching heat supplied by the at least one horizontal electrode 940 and the vertical electrode 950 to the phase-change layer 960. In this case, the OTS may be disposed between the vertical electrode 950 and the tunnel barrier 970.

Furthermore, the phase-change memory 930 may include at least one insulating layer 980 which extends in the first direction to be interposed between the at least one phase-change layer 960 and separate the at least one phase-change layer 960 from each other. The at least one insulating layer 980 may be formed of an insulating material such as $SiO_2$.

The above-described method of manufacturing the phase-change memory 930 may be performed similarly to the method described above with reference to FIGS. 5 and 6A to 6F or FIGS. 7 and 8A to 8H. For example, the manufacturing system may alternately stack the at least one insulating layer 980 and the at least one horizontal electrode 940 extending in the first direction 931, form a vertical hole in the second direction 932, etch a portion of the at least one horizontal electrode 940 exposed to an inner surface of the vertical hole, fill the at least one phase-change layer 960 in a space where the portion of the at least one horizontal electrode 940 is etched, form the tunnel barrier 970 on the inner surface of the vertical hole, and fill the vertical electrode 950 in the vertical hole in which the tunnel barrier 970 is formed to manufacture the phase-change memory 930. In another example, the manufacturing system may alternately stack the at least one insulating layer 980 and at least one sacrificial layer extending in the first direction 931, form a vertical hole in the second direction 932, etch a portion of the at least one sacrificial layer exposed to an inner surface of the vertical hole, fill the at least one phase-change layer 960 in the space where the portion of the at least one sacrificial layer is etched, form the tunnel barrier 970 on the inner surface of the vertical hole, fill the vertical electrode 950 in the vertical hole where the tunnel barrier 970 is formed, and fill the at least one horizontal electrode 940 in a space where at least one sacrificial layer is removed to manufacture the phase-change memory 930.

As described above, the phase-change memory 930 has been described as including the tunnel barrier 970, but is not defined or limited thereto and may have a structure not including the tunnel barrier 970. In this case, at least one phase-change layer 960 in the phase-change memory 930 is in direct contact with the vertical electrode 950. Accordingly, the vertical electrode 950 may be formed of a material (e.g., tungsten, cobalt, or nickel, etc.) and a thickness which optimizes function (e.g., function to secure Schottky diode characteristics by reducing the off current of the phase-change memory 930 and suppressing the voltage increase in the on state) of the tunnel barrier 970.

Although the embodiments have been described with reference to the limited embodiments and drawings as described above, various modifications and variations are possible to those skilled in the art from the above description. For example, although the described techniques is performed in a different order than the described method, and/or components such as systems, structures, devices, circuits, etc. may be coupled or combined in a different manner than the described method, or may be replaced by other components or equivalents, an appropriate result may be achieved.

Therefore, other implementations, other embodiments, and equivalents to the claims also fall within the scope of the claims that follow.

The invention claimed is:

1. A phase-change memory device comprising:
an upper electrode and a lower electrode;
a phase-change layer in which a crystal state of the phase-change layer is changed by heat supplied by the upper electrode and the lower electrode; and
a selector which selectively switches the heat supplied by the upper electrode and the lower electrode to the phase-change layer,
wherein the selector is formed of a compound which includes a transition metal in a phase-change material, and
the phase-change layer has phase-change characteristics and the selector has reverse phase-change characteristics, such that the selector has a high resistance when a crystal state of the selector is crystalline and a low resistance when the crystal state of the selector is non-crystalline, and the phase-change layer has low resistance when the crystal state of the phase-change layer is crystalline and a high resistance when the crystal state of the phase-change layer is non-crystalline.

2. The phase-change memory device of claim 1, wherein a composition ratio in which the transition metal is contained in the phase-change material is adjusted to maximize a resistance ratio between when the crystal state of the selector is crystalline and when the crystal state of the selector is non-crystalline, to allow an operating voltage value of the selector to be less than a reference operating voltage value, or to allow a power consumption of the selector to be less than a reference power consumption value.

3. The phase-change memory device of claim 1, wherein the phase-change memory device,
performs a set operation of a write operation in response to the crystal state of the selector being changed to crystalline to be set to a high resistance state and the crystal state of the phase-change layer being changed to crystalline to be set to a low resistance state, and
performs a reset operation of the write operation in response to the crystal state of the selector being changed to non-crystalline to be set to a low resistance state and the crystal state of the phase-change layer being changed to non-crystalline to be set to a high resistance state.

4. The phase-change memory device of claim 3, wherein the selector maintains an off state in response to the phase-change memory device being set to the high resistance state in both the set operation and the reset operation.

5. The phase-change memory device of claim 1, wherein the phase-change memory device performs a read operation in response to a crystal state of a local region being changed from non-crystalline to crystalline to be set to an off state after the crystal state of the local region is changed from crystalline to non-crystalline to be set to an on state.

6. The phase-change memory device of claim 1, further comprising:
a tunnel barrier disposed between the phase-change layer and the selector to reduce an off current of the selector or block intermixing between the phase-change layer and the selector.

7. The phase-change memory device of claim 1, wherein the transition metal includes at least one of Cr, Ti, Ni, Zn, Cu, or Mo, and
wherein the phase-change material includes Ge and/or Te.

8. The phase-change memory device of claim 1, wherein the selector adjusts contact resistivity based on a material forming either the upper electrode or the lower electrode.

9. A selector used in a memory device, wherein the selector is formed of a compound containing a transition metal in a phase-change material to have a high resistance when a crystal state of the selector is crystalline and to have a low resistance when the crystal state of the selector is non-crystalline,
wherein the selector changes a crystal state of a local region between crystalline and non-crystalline to be switched between an on state and an off state.

10. The selector of claim 9, wherein a composition ratio in which in which the transition metal is contained in the phase-change material is adjusted to maximize a resistance ratio between when the crystal state of the selector is crystalline and when the crystal state of the selector is non-crystalline, to allow an operating voltage value of the selector to be less than a reference operating voltage value, or to allow a power consumption of the selector to be less than a reference power consumption value.

11. The selector of claim 9, further comprising:
a tunnel barrier disposed between at least one electrode included in the memory device and the selector to reduce an off current of the selector.

12. A phase-change layer used in a phase-change memory device including an upper electrode and a lower electrode, wherein the phase-change layer is formed of a compound containing a transition metal in a phase-change material to change a crystal state by heat supplied by the upper electrode and the lower electrode, to have a high resistance when the crystal state of the phase-change layer is crystalline and to have a low resistance when the crystal state of phase-change layer is non-crystalline,
wherein the phase-change layer changes a crystal state of a local region between crystalline and non-crystalline to be switched between an on state and an off state.

13. The phase-change layer of claim 12, wherein the phase-change memory device further includes a tunnel barrier disposed between any one of the upper electrode or the lower electrode and the phase-change layer.

14. The phase-change layer of claim 12, wherein the phase-change memory device further includes an ovonic threshold switching (OTS) selectively switching the heat supplied by the upper electrode and the lower electrode to the phase-change layer.

* * * * *